(12) United States Patent
Vogt

(10) Patent No.: US 7,340,537 B2
(45) Date of Patent: Mar. 4, 2008

(54) MEMORY CHANNEL WITH REDUNDANT PRESENCE DETECT

(75) Inventor: Pete D. Vogt, Boulder, CO (US)

(73) Assignee: Intel Corporation, Santa Clara, CA (US)

( * ) Notice: Subject to any disclaimer, the term of this patent is extended or adjusted under 35 U.S.C. 154(b) by 272 days.

(21) Appl. No.: 10/456,178

(22) Filed: Jun. 4, 2003

(65) Prior Publication Data

US 2004/0246785 A1 Dec. 9, 2004

(51) Int. Cl.
*G06F 3/00* (2006.01)

(52) U.S. Cl. .............................. 710/2; 710/15; 710/300; 711/100

(58) Field of Classification Search ...................... 710/2, 710/8, 15, 62, 300, 301; 711/100, 170
See application file for complete search history.

(56) References Cited

U.S. PATENT DOCUMENTS

| | | | |
|---|---|---|---|
| 5,253,357 A | 10/1993 | Allen et al. | |
| 5,539,912 A * | 7/1996 | Clarke et al. | 710/104 |
| 5,742,840 A | 4/1998 | Hansen et al. | |
| 5,748,872 A | 5/1998 | Norman | |
| 5,860,080 A | 1/1999 | James et al. | |
| 5,860,134 A * | 1/1999 | Cowell | 711/172 |
| 5,867,422 A | 2/1999 | John | |
| 5,898,863 A | 4/1999 | Ofer et al. | |
| 6,006,318 A | 12/1999 | Hansen et al. | |
| 6,034,878 A | 3/2000 | Osaka et al. | |
| 6,038,682 A | 3/2000 | Norman | |
| 6,092,229 A | 7/2000 | Boyle et al. | |
| 6,125,419 A | 9/2000 | Umemura et al. | |
| 6,128,750 A | 10/2000 | Espy et al. | |
| 6,151,648 A | 11/2000 | Haq | |
| 6,154,826 A | 11/2000 | Wulf et al. | |
| 6,154,855 A | 11/2000 | Norman | |
| 6,160,423 A | 12/2000 | Haq | |
| 6,185,644 B1 | 2/2001 | Farmwald et al. | |
| 6,255,859 B1 | 7/2001 | Haq | |
| 6,263,413 B1 | 7/2001 | Motomura et al. | |
| 6,317,352 B1 | 11/2001 | Halbert et al. | |
| 6,327,205 B1 | 12/2001 | Haq | |
| 6,345,321 B1 | 2/2002 | Litaize et al. | |
| 6,369,605 B1 | 4/2002 | Bonella et al. | |

(Continued)

FOREIGN PATENT DOCUMENTS

WO WO99/30240 6/1999

(Continued)

OTHER PUBLICATIONS

U.S. Appl. No. 10/713,868, filed Nov. 14, 2003, Pete D. Vogt.

(Continued)

*Primary Examiner*—Kim Huynh
*Assistant Examiner*—Eron J. Sorrell
(74) *Attorney, Agent, or Firm*—Marger Johnson & McCollom, PC

(57) ABSTRACT

A memory agent may include a link interface having bit lanes and may utilize more than one bit lane to determine if another memory agent is also connected to the same link interface.

19 Claims, 15 Drawing Sheets

U.S. PATENT DOCUMENTS

| | | | |
|---|---|---|---|
| 6,408,402 | B1 | 6/2002 | Norman |
| 6,449,213 | B1 | 9/2002 | Dodd et al. |
| 6,487,102 | B1 | 11/2002 | Halbert et al. |
| 6,493,250 | B2 | 12/2002 | Halbert et al. |
| 6,502,161 | B1 | 12/2002 | Perego et al. |
| 6,513,080 | B1 | 1/2003 | Haq |
| 6,625,687 | B1 | 9/2003 | Halbert et al. |
| 6,625,692 | B1 * | 9/2003 | Stubbs et al. ............... 711/115 |
| 6,643,752 | B1 | 11/2003 | Donnelly et al. |
| 6,745,267 | B2 * | 6/2004 | Chen et al. ................... 710/74 |
| 6,813,668 | B2 * | 11/2004 | Tseng et al. ................ 710/301 |
| 2004/0230718 | A1 | 11/2004 | Polzin et al. |

FOREIGN PATENT DOCUMENTS

| | | |
|---|---|---|
| WO | WO99/41666 | 8/1999 |
| WO | WO99/41667 | 8/1999 |

OTHER PUBLICATIONS

U.S. Appl. No. 10/714,025, filed Nov. 14, 2003, Pete D. Vogt.
U.S. Appl. No. 10/714,026, filed Nov. 14, 2003, Pete D. Vogt.
U.S. Appl. No. 10/883,474, filed Jun. 30, 2004, Pete D. Vogt.
U.S. Appl. No. 10/882,999, filed Jun. 30, 2004, Pete D. Vogt.
U.S. Appl. No. 10/859,438, filed May 31, 2004, Pete D. Vogt.
U.S. Appl. No. 10/858,850, filed May 31, 2004, Pete D. Vogt.
U.S. Appl. No. 10/859,060, filed May 31, 2004, Pete D. Vogt.
The Institute of Electrical and Electronics Engineers, Inc., *IEEE Standard for Scalable Coherent Interface (SCI)*, May 23, 2001, 1-243 pp.
R. Ng (Sun Microsystems, Inc.), *Fast Computer Memories*, IEEE Spectrum, Oct. 1992, pp. 36-39.
R.H.W. Salters (Philips Research Laboratories), *Fast DRAMs for Sharper TV*, IEEE Spectrum, Oct. 1992, pp. 40-42.
F. Jones (United Memories, Inc.), *A New Era of Fast Dynamic RAMs*, IEEE Spectrum, Oct. 1992, pp. 43-49.
M. Farmwald and D. Mooring (Rambus, Inc.), *A Fast Path to One Memory*, IEEE Spectrum, Oct. 1992, pp. 50-51.
S. Gjessing (University of Oslo), D.B. Gustavson (Stanford Linear Accelerator Center), D.V. James and G. Stone (Apple Computer, Inc.) and H. Wigger (Hewlett-Packard Co.), *A RAM Link for High Speed*, IEEE Spectrum, Oct. 1992, pp. 52-53.
The Institute of Electrical and Electronics Engineers, Inc., *IEEE Standard for High-Bandwidth Memory Interface Based on Scalable Coherent Interface (SCI) Signaling Technology (RamLink)*, 1996, 1-91 pp.
U.S. Appl. No. 10/454,399, filed Jun. 3, 2003 entitled Memory Channel With Hot Add/Remove by Pete D. Vogt.
U.S. Appl. No. 10/454,400, filed Jun. 3, 2003 entitled Memory Channel Utilizing Permuting Status Patterns by Pete D. Vogt and James W. Alexander.
U.S. Appl. No. 10/454,398, filed Jun. 3, 2003 entitled Data Signaling Redrive With Dynamic Sampling Adjustment by Pete D. Vogt.
U.S. Appl. No. 10/456,206, filed Jun. 4, 2003 entitled Memory Channel Having Deskew Separate From Redrive by Pete D. Vogt.
U.S. Appl. No. 10/456,353, filed Jun. 5, 2003 entitled Memory Channel With Bit Lane Fail-Over by Pete D. Vogt, Dennis W. Brzezinski and Warren R. Morrow.
U.S. Appl. No. 10/456,174, filed Jun. 4, 2003 entitled Memory Channel With Unidirectional Links by Pete D. Vogt.

* cited by examiner

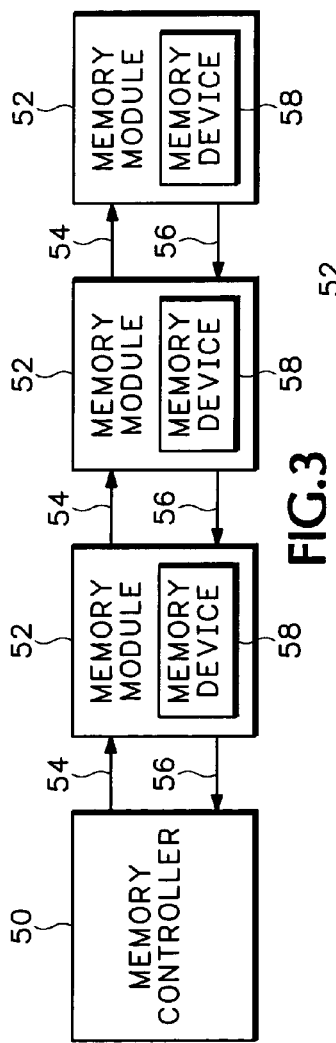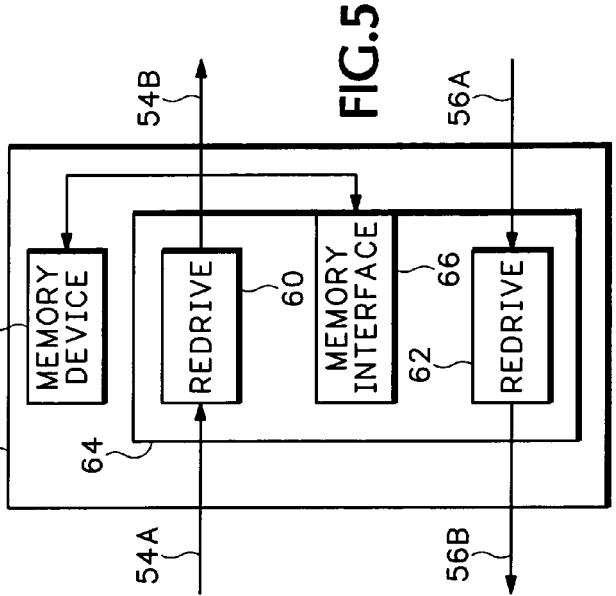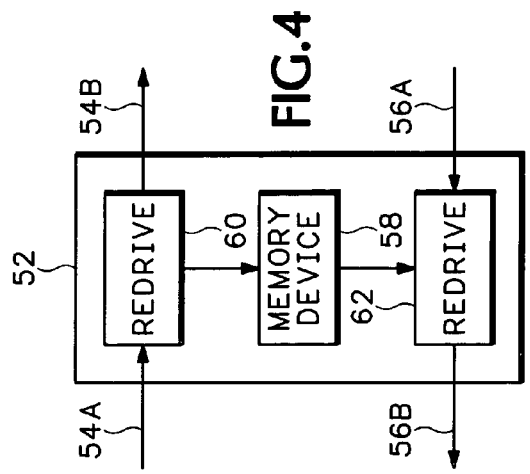

| TRANSFER \ BIT | 12 | 11 | 10 | 9 | 8 | 7 | 6 | 5 | 4 | 3 | 2 | 1 | 0 |
|---|---|---|---|---|---|---|---|---|---|---|---|---|---|
| 0 | 1 | 1 | 0 | 0 | 0 | 0 | 0 | 0 | 0 | 0 | 0 | 0 | 0 |
| 1 | 1 | 1 | 0 | 0 | 0 | 0 | 0 | 0 | 0 | 0 | 0 | 0 | 0 |
| 2 | 1 | 1 | 0 | 0 | 0 | 0 | 0 | 0 | 0 | 0 | 0 | 0 | 0 |
| 3 | 1 | 1 | 0 | 0 | 0 | 0 | 0 | 0 | 0 | 0 | 0 | 0 | 0 |
| 4 | 1 | 1 | 0 | 0 | 0 | 0 | 0 | 0 | 0 | 0 | 0 | 0 | 0 |
| 5 | 1 | 1 | 0 | 0 | 0 | 0 | 0 | 0 | 0 | 0 | 0 | 0 | 0 |
| 6 | 1 | 1 | 0 | 0 | 0 | 0 | 0 | 0 | 0 | 0 | 0 | 0 | 0 |
| 7 | 1 | 1 | 0 | 0 | 0 | 0 | 0 | 0 | 0 | 0 | 0 | 0 | 0 |
| 8 | 1 | 1 | 0 | 0 | 0 | 0 | 0 | 0 | 0 | 0 | 0 | 0 | 0 |
| 9 | 1 | 1 | 0 | 0 | 0 | 0 | 0 | 0 | 0 | 0 | 0 | 0 | 0 |
| 10 | 1 | 1 | 0 | 0 | 0 | 0 | 0 | 0 | 0 | 0 | 0 | 0 | 0 |
| 11 | 1 | 1 | 0 | 0 | 0 | 0 | 0 | 0 | 0 | 0 | 0 | 0 | 0 |

FIG.21

| TRANSFER \ BIT | 12 | 11 | 10 | 9 | 8 | 7 | 6 | 5 | 4 | 3 | 2 | 1 | 0 |
|---|---|---|---|---|---|---|---|---|---|---|---|---|---|
| 0 | 0 | 0 | 1 | 0 | 0 | 0 | 0 | 0 | 0 | 0 | 0 | 0 | 0 |
| 1 | 0 | 0 | 1 | 0 | 0 | 0 | 0 | 0 | 0 | 0 | 0 | 0 | 0 |
| 2 | 0 | 0 | 1 | 0 | 0 | 0 | 0 | 0 | 0 | 0 | 0 | 0 | 0 |
| 3 | 0 | 0 | 1 | 0 | 0 | 0 | 0 | 0 | 0 | 0 | 0 | 0 | 0 |
| 4 | 0 | 0 | 1 | 0 | 0 | 0 | 0 | 0 | 0 | 0 | 0 | 0 | 0 |
| 5 | 0 | 0 | 1 | 0 | 0 | 0 | 0 | 0 | 0 | 0 | 0 | 0 | 0 |
| 6 | 0 | 0 | 1 | 0 | 0 | 0 | 0 | 0 | 0 | 0 | 0 | 0 | 0 |
| 7 | 0 | 0 | 1 | 0 | 0 | 0 | 0 | 0 | 0 | 0 | 0 | 0 | 0 |
| 8 | 0 | 0 | 1 | 0 | 0 | 0 | 0 | 0 | 0 | 0 | 0 | 0 | 0 |
| 9 | 0 | 0 | 1 | 0 | 0 | 0 | 0 | 0 | 0 | 0 | 0 | 0 | 0 |
| 10 | 0 | 0 | 1 | 0 | 0 | 0 | 0 | 0 | 0 | 0 | 0 | 0 | 0 |
| 11 | 0 | 0 | 1 | 0 | 0 | 0 | 0 | 0 | 0 | 0 | 0 | 0 | 0 |

FIG.22

| TRANSFER \ BIT | 12 | 11 | 10 | 9 | 8 | 7 | 6 | 5 | 4 | 3 | 2 | 1 | 0 |
|---|---|---|---|---|---|---|---|---|---|---|---|---|---|
| 0 | 0 | 0 | 0 | 1 | 0 | 0 | 0 | 0 | 0 | 0 | 0 | 0 | 0 |
| 1 | 0 | 0 | 0 | 1 | 0 | 0 | 0 | 0 | 0 | 0 | 0 | 0 | 0 |
| 2 | 0 | 0 | 0 | 1 | 0 | 0 | 0 | 0 | 0 | 0 | 0 | 0 | 0 |
| 3 | 0 | 0 | 0 | 1 | 0 | 0 | 0 | 0 | 0 | 0 | 0 | 0 | 0 |
| 4 | 0 | 0 | 0 | 1 | 0 | 0 | 0 | 0 | 0 | 0 | 0 | 0 | 0 |
| 5 | 0 | 0 | 0 | 1 | 0 | 0 | 0 | 0 | 0 | 0 | 0 | 0 | 0 |
| 6 | 0 | 0 | 0 | 1 | 0 | 0 | 0 | 0 | 0 | 0 | 0 | 0 | 0 |
| 7 | 0 | 0 | 0 | 1 | 0 | 0 | 0 | 0 | 0 | 0 | 0 | 0 | 0 |
| 8 | 0 | 0 | 0 | 1 | 0 | 0 | 0 | 0 | 0 | 0 | 0 | 0 | 0 |
| 9 | 0 | 0 | 0 | 1 | 0 | 0 | 0 | 0 | 0 | 0 | 0 | 0 | 0 |
| 10 | 0 | 0 | 0 | 1 | 0 | 0 | 0 | 0 | 0 | 0 | 0 | 0 | 0 |
| 11 | 0 | 0 | 0 | 1 | 0 | 0 | 0 | 0 | 0 | 0 | 0 | 0 | 0 |

MEMORY CHANNEL WITH REDUNDANT PRESENCE DETECT

BACKGROUND

FIG. 1 illustrates a prior art memory system known informally as RamLink which was proposed as a standard by the Institute of Electrical and Electronics Engineers (IEEE). The standard was designated as IEEE Std 1596.4-1996 and is known formally as *IEEE Standard for High-Bandwidth Memory Interface Based on Scalable Coherent Interface (SCI) Signaling Technology (RamLink)*. The system of FIG. 1 includes a memory controller 10 and one or more memory modules 12. The memory controller 10 is typically either built into a processor or fabricated on a companion chipset for a processor. Each memory module 12 has a slave interface 14 that has one link input and one link output. The components are arranged in a RamLink signaling topology known as RingLink with unidirectional links 16 between components. A control interface 18 on each module interfaces the slave interface 14 with memory devices 20. In the system shown in FIG. 1, another RamLink signaling topology known as SyncLink is used between the slave interfaces and memory devices.

The purpose of the RamLink system is to provide a processor with high-speed access to the memory devices. Data is transferred between the memory controller and modules in packets that circulate along the RingLink. The controller is responsible for generating all request packets and scheduling the return of slave response packets.

A write transaction is initiated when the controller sends a request packet including command, address, time, and data to a particular module. The packet is passed from module to module until it reaches the intended slave which then passes the data to one of the memory devices for storage. The slave then sends a response packet, which is passed from module to module until it reaches the controller to confirm that the write transaction was completed.

A read transaction is initiated when the controller sends a request packet including command, address, and time to a module. The slave on that module retrieves the requested data from one of the memory devices and returns it to the controller in a response packet which is again passed from module to module until it reaches the controller.

FIG. 2 illustrates a prior art RamLink slave interface circuit. In the circuit of FIG. 2, source-synchronous strobing is used to clock the incoming data signals. That is, a strobe signal, which accompanies the incoming data signals, is used to sample the incoming data. The circuit of FIG. 2 uses a phase-locked loop (PLL) to generate a stable local clock signal from a reference clock signal that is distributed to other slave interface circuits. The local clock signal is used to reclock the outgoing data signal so as to avoid cumulative jitter as the data is passed along downstream.

BRIEF DESCRIPTION OF THE DRAWINGS

FIG. 3 illustrates an embodiment of a memory interface system according to the inventive principles of this patent.

FIG. 4 illustrates an embodiment of a memory module according to the inventive principles of this patent.

FIG. 5 illustrates another embodiment of a memory module and an embodiment of a memory buffer according to the inventive principles of this patent.

FIG. 19 illustrates an embodiment of a permuting pattern generator in accordance with the inventive principles of this patent.

FIGS. 20 through 23 illustrate example embodiments of status patterns in accordance with the inventive principles of this patent.

FIG. 24 illustrates an embodiment of a memory agent according to the inventive principles of this patent.

DETAILED DESCRIPTION

Figure 1:
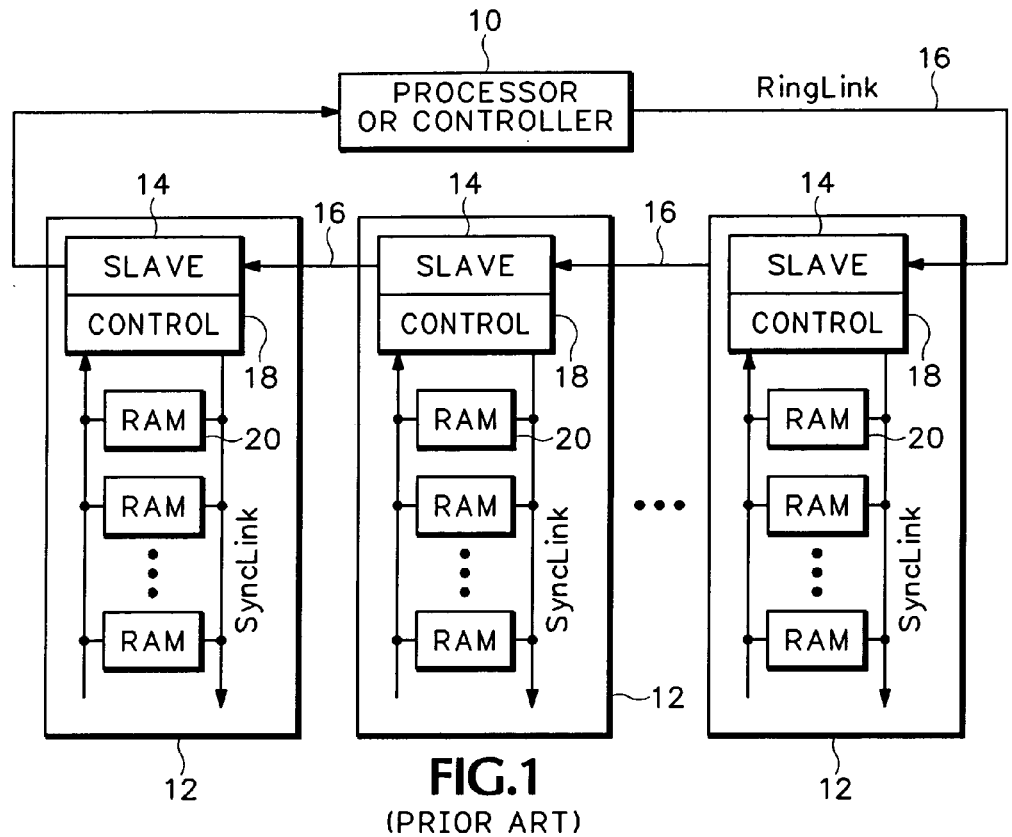
FIG. 1 illustrates a prior art RamLink memory system.
Figure 2:
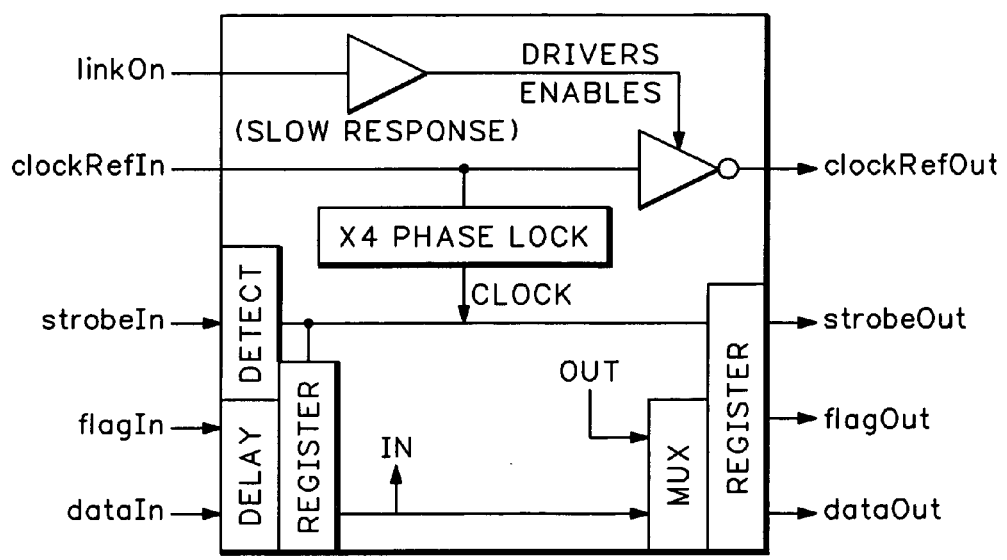
FIG. 2 illustrates a prior art RamLink slave interface circuit.

This patent encompasses numerous inventions that have independent utility. In some cases, additional benefits are realized when some of the principles are utilized in various combinations with one another, thus giving rise to additional inventions. These principles may be realized in myriad embodiments. Although some specific details are shown for purposes of illustrating the inventive principles, numerous other arrangements may be devised in accordance with the inventive principles of this patent. Thus, the inventive principles are not limited to the specific details disclosed herein.

FIG. 3 illustrates an embodiment of a memory interface system according to the inventive principles of this patent. The system of FIG. 3 includes a memory controller 50 and one or more memory modules 52 that communicate through a channel made up of unidirectional links. The channel has an outbound path that includes one or more outbound links 54, and an inbound path that includes one or more inbound links 56. Each module may be capable of redriving signals from link to link on the outbound path and from link to link on the inbound path. Each module may also be capable of selectively disabling any redrive features, for example, if the module detects that it is the outermost module, or responsive to a command from the memory controller.

Each module includes one or more memory devices 58 arranged to transfer data to and/or from one or more of the paths. For example, the module may be arranged such that data from the outbound path is transferred to a memory device, and data from the memory device is transferred to the inbound path. One or more buffers may be disposed between one or more memory devices and one or more of the paths. The modules and controller are not limited to any particular mechanical arrangement. For example, the modules may be fabricated on substrates separate from the rest of the system, they may be fabricated on a common substrate with the controller and links, or they may be realized in any other mechanical arrangement. The modules are also not limited to any particular type of memory device, e.g., read only memory (ROM), dynamic random access memory (DRAM), flash memory, etc.

FIG. 4 illustrates an embodiment of a memory module according to the inventive principles of this patent. The module of FIG. 4 includes two redrive circuits 60 and 62 to receive signals on unidirectional links 54A and 56A, and redrive the signals on unidirectional links 54B and 56B, respectively. One or more memory devices 58 are arranged to transfer data to and/or from one or more of the redrive circuits.

The module of FIG. 4 is not limited to any particular arrangement of unidirectional links or any particular arrangement for transferring data to and/or from the redrive circuits. If the module of FIG. 4 is to be used in a memory system such as that shown in FIG. 3, then redrive circuit 60 might be designated as an outbound redrive circuit and arranged to receive and redrive signals on an outbound path including links 54A and 54B, and the other redrive circuit 62 might be designated as an inbound redrive circuit and arranged to receive and redrive signals on an inbound path including links 56A and 56B. In this example, one or more memory devices 58 may be arranged so that data is transferred from the outbound redrive circuit 60 to the memory device(s) and from the memory device(s) to the inbound redrive circuit 62.

The module may be capable of detecting if it is the outermost module on a channel and selectively disabling any redrive features accordingly. For example, if the module of FIG. 4 is to be used in a memory system such as that shown in FIG. 3, and the module detects that it is the outermost module, the outbound redrive circuit receives incoming signals on link 54A but does not redrive them. Likewise, the inbound redrive circuit only drives link 56B with signals corresponding to data received from the memory device(s), and/or other signals that may be generated internally by the module. Alternatively, even if the module detects that it is not the outermost module, it may be constructed so that it is capable of operating as though it is the outermost module (for example, in response to a command from a memory controller), in which case it may ignore signals received on inbound link 56A, and it may not redrive signals onto outbound link 54B.

FIG. 5 illustrates another embodiment of a memory module and an embodiment of a memory buffer according to the inventive principles of this patent. The module of FIG. 5 includes a memory buffer 64 having two redrive circuits 60 and 62 to receive signals on unidirectional links 54A and 56A, and redrive the signals on unidirectional links 54B and 56B, respectively. The memory buffer also includes a memory interface 66 arranged to transfer data to and from one or more memory devices 58. The buffer may be capable of detecting if it is the last agent on a channel and selectively disabling any redrive features accordingly. The buffer may be capable of operating as though it is the last agent on a channel, even if it is not, for example, responsive to a command from a memory controller. As used herein, agent refers to any memory controller (also called a host), module, buffer, etc. that is interfaced to the channel.

The module and buffer of FIG. 5 are not limited to any particular arrangement of unidirectional links or any particular arrangement for transferring between the memory interface and the redrive circuits. If the module of FIG. 5 is to be used in a memory system such as that shown in FIG. 3, then redrive circuit 60 might be designated as an outbound redrive circuit and arranged to receive and redrive signals on an outbound path including links 54A and 54B, and the other redrive circuit 62 might be designated as an inbound redrive circuit and arranged to receive and redrive signals on an inbound path including links 56A and 56B. In this example, the memory interface may be configured to receive data from the outbound redrive circuit 60 and to send data to the inbound redrive circuit 62.

Various mechanical arrangements may be used to implement the memory modules and/or buffer of FIGS. 4 and 5. For example, the memory devices 58, redrive circuits 60 and 62, and buffer 64 may all be realized as separate integrated circuits mounted on a common circuit board or on separate circuit boards. Various combinations of the components may be fabricated together on a common integrated circuit, or they all might be fabricated on a single integrated circuit. The circuit board or boards, if any, may be capable of being plugged into sockets on a motherboard, fabricated integral with a motherboard, or arranged in any other way. There may not be a circuit board, for example, if the components are fabricated as part of a multi-chip module. A memory buffer according to the inventive principles of this patent may be used to interface devices other than memory devices to a channel. For example a memory buffer according to the inventive principles of this patent may be used to interface an I/O controller or a bridge to a channel.

Additional embodiments of apparatus according to the inventive principles of this patent are described with reference to "inbound" and "outbound" paths, links, redrive circuits, etc. to facilitate an understanding of how the apparatus may be utilized in a memory system such as the embodiment shown in FIG. 3. These apparatus, however, are not limited to any particular arrangement of unidirectional links, to the particular arrangements shown for transferring data between the links and other circuitry, or to any of the implementation details shown.

Figure 6:
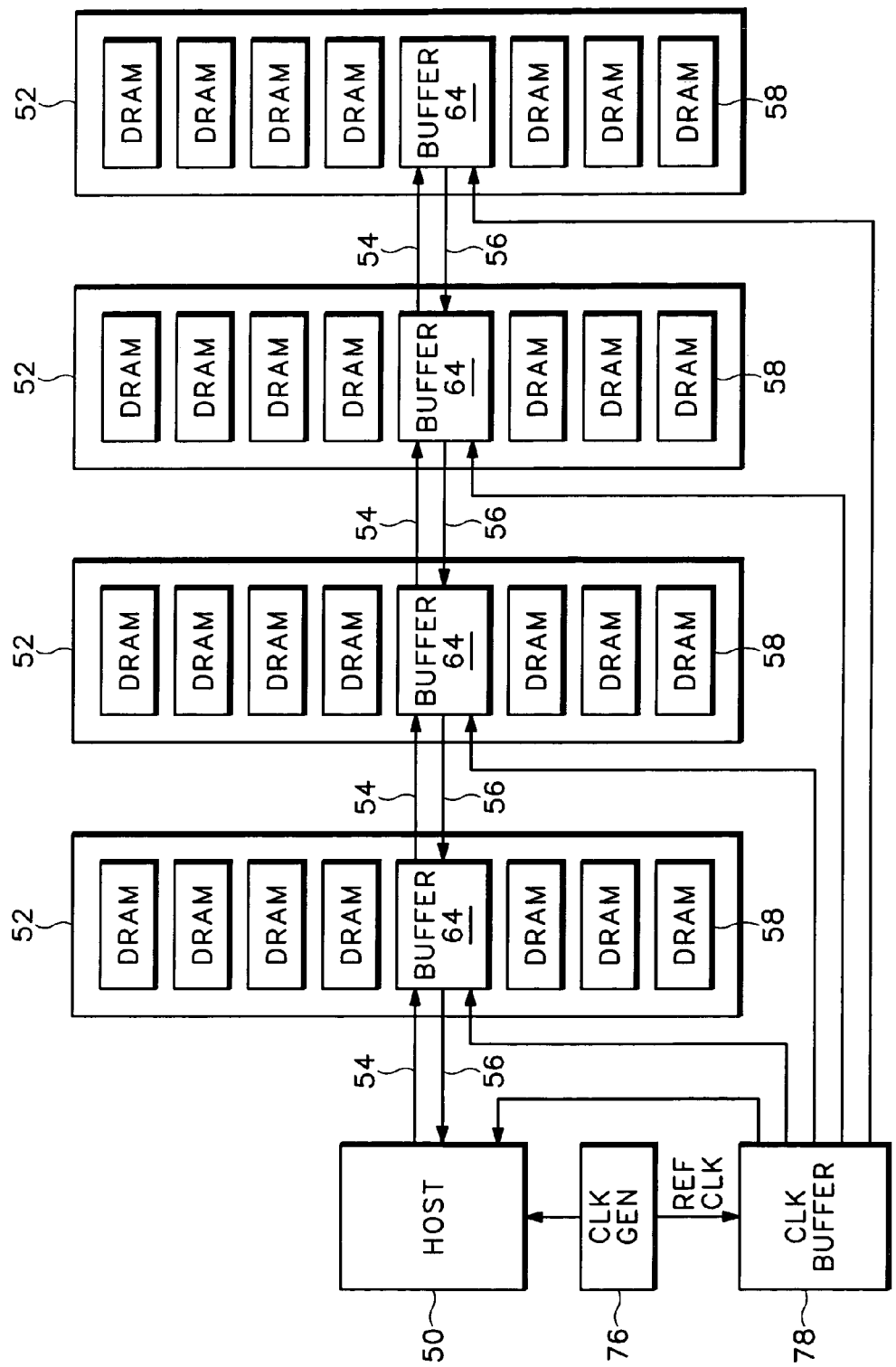
FIG. 6 illustrates additional example embodiments of a memory system, memory modules, and memory buffers according to the inventive principles of this patent.

FIG. 6 illustrates additional example embodiments of a memory system, memory modules, and memory buffers according to the inventive principles of this patent. Referring to FIG. 6, one or more memory modules 52 are based on printed circuit boards having contact fingers along both sides of one edge to create a dual inline memory module (DIMM) that may be plugged into a connector on another circuit board that holds other components of the system. An existing form-factor may be adopted for the module, for example the DIMM form-factor used for Double Data Rate II (DDR2) dynamic random access memory (DRAM) modules.

The modules are populated with memory devices 58, for example, commodity-type DRAM such as DDR2 DRAM. A memory buffer 64 on each module isolates the memory devices from a channel that interfaces the modules to the memory controller 50, which is also referred to as a host. The channel is wired in a point-to-point arrangement with an outbound path that includes outbound links 54, and an inbound path that includes inbound links 56. The links may be implemented with parallel unidirectional bit lanes using low-voltage differential signals.

In the embodiments of FIG. 6, no additional signal lines are used for functions such as command, reset, initialization, and the like. Instead, these functions are encoded directly in the data sent over the channel. Alternatively, however, any number of additional signal lines may be used to implement such functions.

A reference clock signal REF CLK is generated by a clock synthesizer 76 distributed to the host and modules, maybe through a clock buffer 78. This facilitates a quasi-asynchronous clocking scheme in which locally generated clock signals are used to sample and redrive incoming data. Because a common reference clock is available at each agent, data signals may be clocked without any frequency tracking. Alternatively, a local clock signal may be generated independently of any reference clock. As another alternative, a synchronous clocking scheme such as source synchronous strobing may be used.

In one possible embodiment, the host initiates data transfers by sending data, maybe in packets or frames (terms used interchangeably here), to the innermost module on the outbound path. The innermost module receives and redrives the data to the next module on the outbound path. Each module receives and redrives the outbound data until it reaches the outermost module. Although the outermost module could attempt to redrive the data to a "nonexistent" outbound link, each module may be capable of detecting (or being instructed) that it is the outermost module and disabling any redrive circuitry to reduce unnecessary power consumption, noise, etc. In this embodiment, data transfers in the direction of the host, i.e., inbound, are initiated by the outermost module. Each module receives and redrives inbound data along the inbound path until it reaches the host.

Any suitable communication protocol may be used over the physical channel. For example, the host may be designated to initiate and schedule all inbound and outbound data transfers. Alternatively, any agent may be allowed to initiate data transfers. Frames of data may be configured to carry commands, read data, write data, status information, error information, initialization data, idle patterns, etc., or any combination thereof. A protocol may be implemented such that, when the host sends a command frame to a target module along the outbound path, the target module responds by immediately sending a response frame back the host along the inbound path. In such an embodiment, the target module does not redrive the command frame on the outbound path.

In an alternative embodiment, the target module receives the command frame and then redrives the command frame on the outbound path. When the outermost module receives the command frame, it initiates a response frame (maybe nothing more than an idle frame) on the inbound path. The target module waits until the response frame reaches its inbound receiver. The target module then mergers its response into the inbound data stream, e.g., by replacing the response frame sent by the outermost module with the target module's true response frame.

Figure 7:
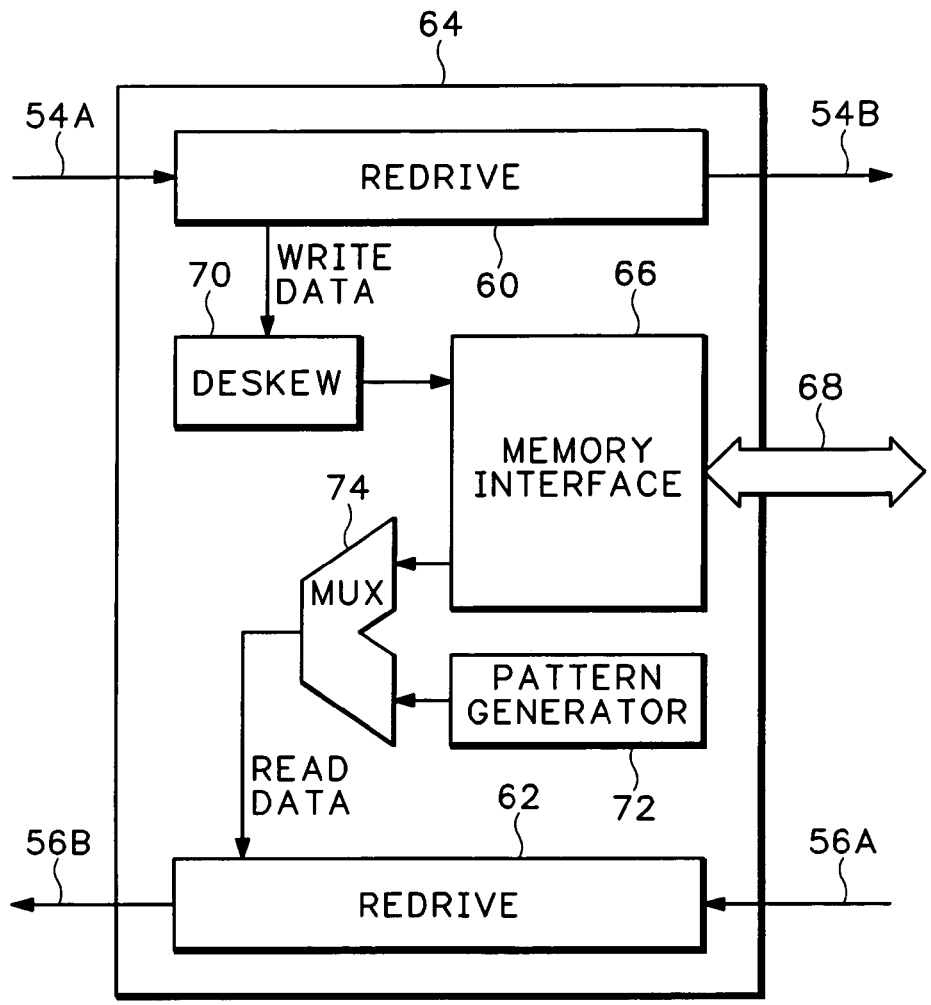
FIG. 7 illustrates another example embodiment of a memory buffer according to the inventive principles of this patent.

FIG. 7 illustrates another example embodiment of a memory buffer according to the inventive principles of this patent. The memory buffer of FIG. 7 includes an outbound redrive circuit 60 to receive and redrive signals on an outbound path including links 54A and 54B, and an inbound redrive circuit 62 to receive and redrive signals on an inbound path including links 56A and 56B. A memory interface 66 interfaces the buffer to one or more memory devices, which may be through a memory bus 68. The memory interface may include read and or write buffers such as FIFO buffers. Data from the outbound path is coupled to the memory interface, which may be through a deskew circuit 70 which eliminates skew between bits of data if the outbound path has more than one bit lane. A pattern generator 72 may be used to generate status patterns to transmit onto the inbound path, for example, if the buffer happens to be the outermost agent on a channel, in which case, there may be no signals being received on incoming inbound link 56A. A multiplexer 74 selectively couples data from the memory interface or pattern generator to the inbound redrive circuit.

The memory interface is not limited to any particular arrangement, and it may be compatible with standard memory devices, particularly commodity memory devices such as DDR2 DRAM. The entire memory buffer may be integrated on a single integrated circuit, it may be integrated into one or more memory devices, its constituent elements may be integrated onto separate components, or any other mechanical arrangement may be employed. The embodiment shown in FIG. 7 is exemplary only, and other embodiments are possible in accordance with the inventive principles of this patent. For example, the embodiment of FIG. 7 is shown with unidirectional data flowing from the outbound redrive circuit to the memory interface and from the memory interface to the inbound redrive circuit. This data flow, however, may be bi-directional, and other arrangements are contemplated. Even if the embodiment of FIG. 7 is to be used in a channel system in which data for the memory interface only needs to flow as shown in FIG. 7, it may still be realized with redrive circuits having full bi-directional data access as this may facilitate, for example, implementation of built-in self-test (BIST) functions, in which case a second deskew circuit for deskewing data from the inbound path may be helpful.

Figure 8:
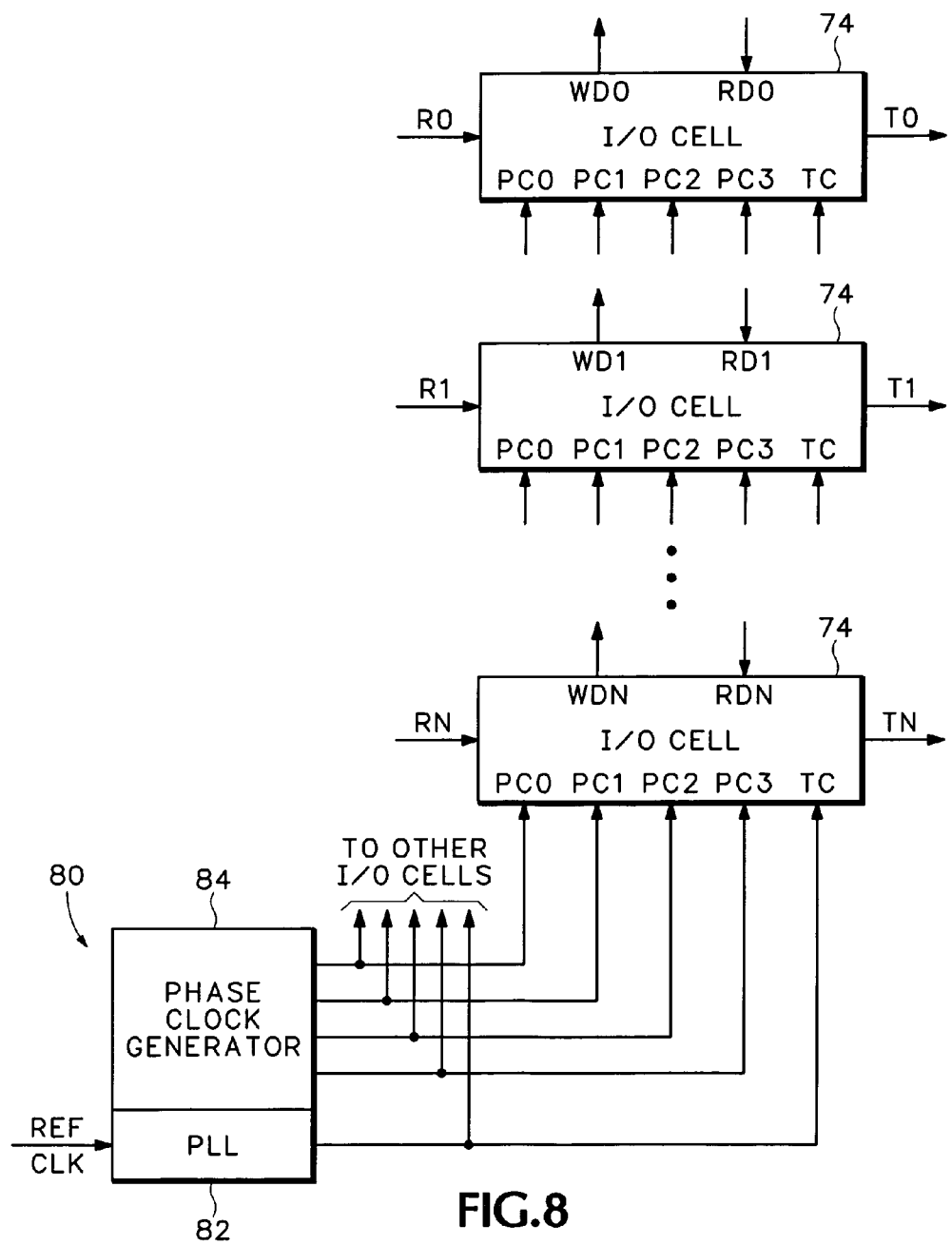
FIG. 8 illustrates an embodiment of a redrive circuit according to the inventive principles of this patent.

FIG. 8 illustrates an embodiment of a redrive circuit according to the inventive principles of this patent. The circuit of FIG. 8 includes one or more input/output (I/O) cells 74, each of which receives an input data signal RX that it may redrive as an output data signal TX. Alternatively, an I/O cell may substitute or merge a read data signal RDX into the output data signal. A write data signal WDX may be taken from the input data signal, either before or after it is redriven as the output data signal.

The "X" in any of the above signal names indicates that it might be one of multiple similar signals depending on the number of I/O cells in the redrive circuit. For example, a redrive circuit having nine bit lanes would have nine I/O cells with input data signals named R0, R1 . . . R8. In a redrive circuit with only a single I/O cell, the data input signal would be R0 or simply R. The term RX is used to refer generically to any or all of the input data signals.

The term "write data" is used for convenience to indicate any data being taken from the data stream traveling through the I/O cell. This does not imply, however, that write data must be directed to a memory interface or memory device. Likewise, "read data" refers to any data that is input to the I/O cell, but read data may come from any source, not just a memory device or memory interface.

Referring again to FIG. 8, a clock generator 80 generates a number of phase clock signals PCX and a transmit clock signal TC in response to a reference clock signal REF CLK. The clock generator includes a phase locked loop (PLL) 82 that generates the transmit clock TC as a multiple of the reference clock signal REF CLK, and a phase clock generator 84. In one possible embodiment, there are four phase clock signals PC0, PC1, PC2 and PC3 spaced 90 degrees apart and derived from the transmit clock TC. Each of the I/O cells may use one or more of the TC and PCX clock signals to sample and/or redrive data signals, and/or to generate additional local clock signals. In this embodiment, the phase clock and transmit clock signals are stable signals in the sense that they are not adjusted in response to the phase of any of the input data signals RX.

Figure 9:
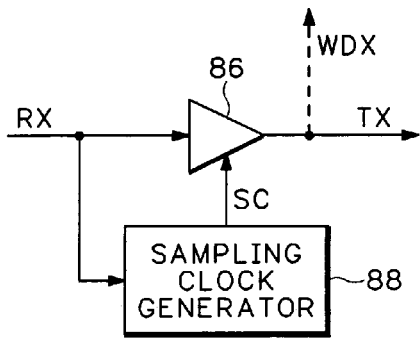
FIG. 9 illustrates an embodiment of an I/O cell according to the inventive principles of this patent.

FIG. 9 illustrates an embodiment of an I/O cell according to the inventive principles of this patent. A receiver 86 is arranged to receive a data signal RX and redrive it as data signal TX in response to a sampling clock signal SC. The sampling clock signal is generated by a sampling clock generator 88 which is capable of adjusting the sampling clock signal in response to the data signal RX. A write data signal WDX may be taken from the input or the output of receiver 86. If taken from the output of the receiver as shown in FIG. 9, the sampling clock signal SC may be used as, or to derive, a strobe signal for the write data. The input to the sampling clock generator may be taken from points other than the input of the receiver as shown in FIG. 9. For example, it may be taken from the output of the receiver as well.

Figure 10:
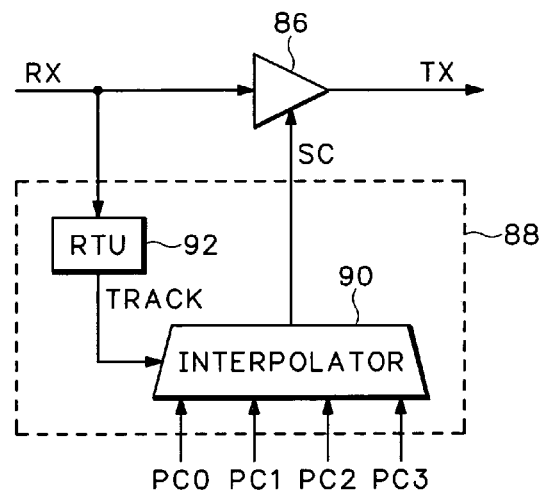
FIG. 10 illustrates another embodiment of an I/O cell according to the inventive principles of this patent.

FIG. 10 illustrates another embodiment of an I/O cell according to the inventive principles of this patent. In the embodiment of FIG. 10, the sampling clock generator 88 is implemented with an interpolator 90 and a receiver tracking unit (RTU) 92. The interpolator generates the sampling clock signal by interpolating between a number of phase clock signals PCX (in this case four signals that are 90 degrees out of phase) in response to a tracking signal from the receiver tracking unit. The receiver tracking unit observes the data signal RX and adjusts the tracking signal so that the sampling clock signal causes the receiver to sample and redrive the data signal at an appropriate time. Thus, the sampling clock signal may dynamically track the data signal.

In one possible embodiment, the receiver tracking unit observes transitions in the data signal RX by over sampling the data signal and adjusting the sampling clock signal to sample and redrive the data signal at the center of the data eye, i.e., at the midway point between transitions in the data signal. The sampling clock generator 88 may include a loop filter that measures several bit cells and may eventually determine that it should adjust the phase of the sampling clock signal to capture the data closer to the center of the data eye location. The input to the sampling clock generator may be taken from points other than the input of the receiver as shown in FIG. 10. For example, it may be taken from the output of the receiver as well.

An embodiment of an I/O cell according to the inventive principles of this patent may be used with scheme that trains the I/O cells to dynamically track the data signal. For example, if the I/O cell of FIG. 10 is used as one of the memory modules shown in FIG. 3, the host may periodically send training frames onto the outbound path. These training frames have an edge density that is adequate to assure that the receiver tracking unit observes enough transitions in the data signal to be able to adjust the sampling clock signal. Likewise, the outermost module in FIG. 3 may periodically send training frames onto the inbound path.

Figure 11:
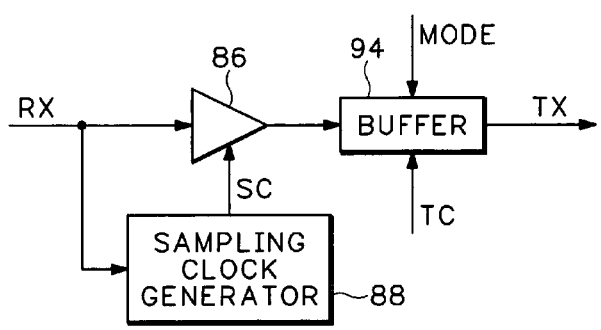
FIG. 11 illustrates another embodiment of an I/O cell according to the inventive principles of this patent.

FIG. 11 illustrates another embodiment of an I/O cell according to the inventive principles of this patent. The embodiment of FIG. 11 is similar to that of FIG. 9, but a buffer 94 is added in the data signal path. The buffer 94 may be a jitter avoidance or drift compensation buffer that compensates for voltage and temperature induced effects. The buffer resynchronizes the data signal TX to a transmit clock signal TC. The transmit clock signal is stable in the sense that its phase is not adjusted in response to the data signal the way the sample clock signal SC is.

In the embodiment of FIG. 11, the buffer is capable of operating in either a pass-through mode, or a redrive mode in response to a mode signal. In pass-through mode, the signal passes through without being sampled and redriven. In redrive mode, the signal is sampled and redriven in response to the clock signal. This enables the I/O cell to operate in different redrive modes. In one possible embodiment, the buffer operates in pass through mode if the mode signal is asserted. This is referred to as resample mode and may result in a shorter latency because the data signal is being redriven by the same clock that is used to sample the data. When the mode signal is not asserted, the buffer operates in redrive mode, so the data is resynchronized to the transmit clock. This is referred to as resync mode and may result in a longer latency but may reduce jitter. The I/O cell may be designed into a memory buffer or module that has an input for receiving the mode signal. If the memory buffer or module is to be used on a system in which there is a relatively short signal path to the next agent, the input may be asserted (or not asserted depending on polarity) to cause the I/O cell to operate in resample mode because more jitter may be tolerated on a short signal path. On the other hand, if the memory buffer or module is to be used on a system in which there is a relatively long signal path to the next agent, the input may be de-asserted to cause the I/O cell to operate in resync mode because this reduces jitter, albeit at the possible expense of longer latency. Alternatively, a registered flag may be used on the memory buffer or module, or in a redrive circuit, or in the I/O cell itself to control the mode signal.

Figure 12:
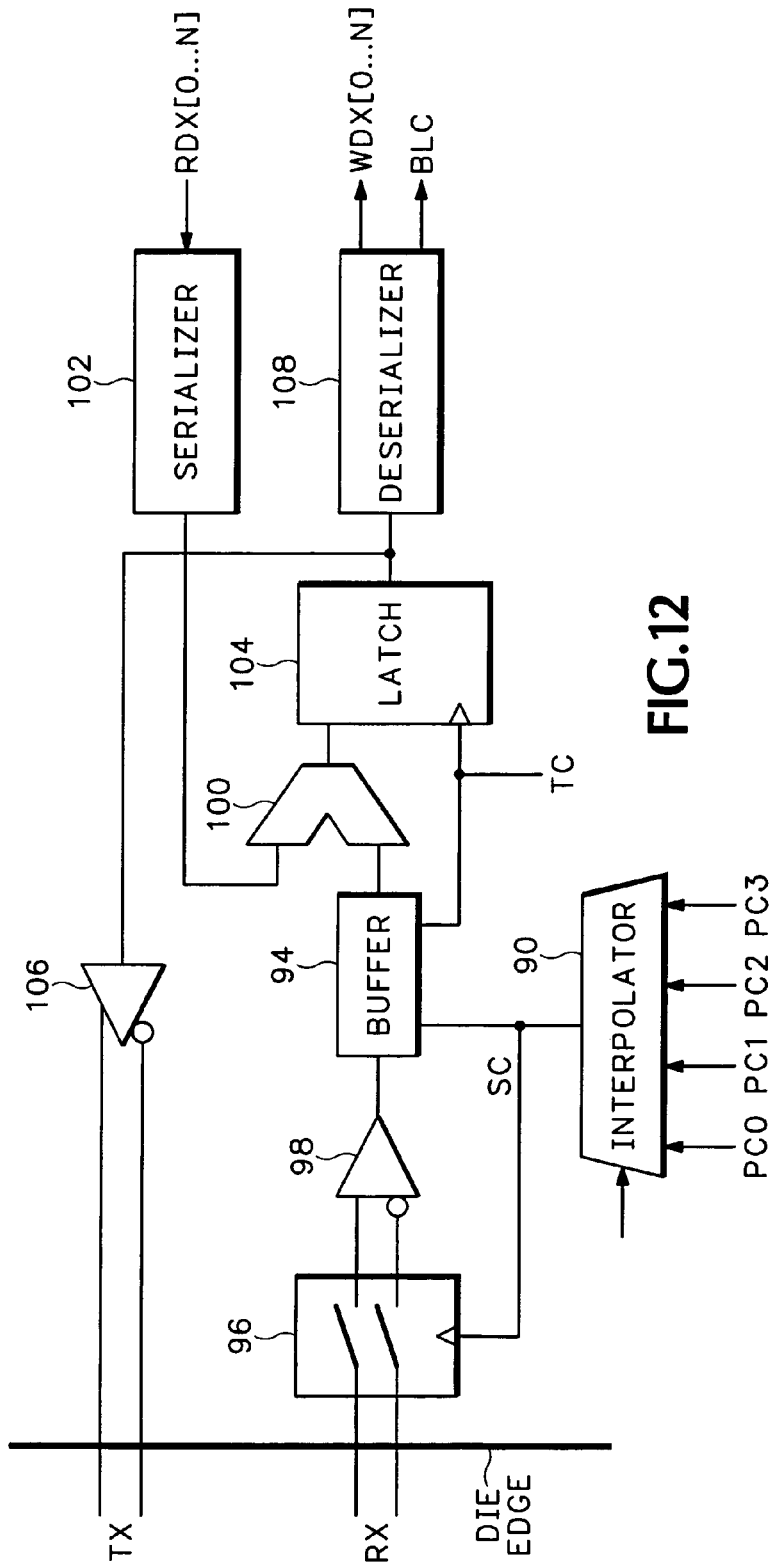
FIG. 12 illustrates another embodiment of an I/O cell according to the inventive principles of this patent.

FIG. 12 illustrates another embodiment of an I/O cell according to the inventive principles of this patent. In the embodiment of FIG. 12, the received and transmitted data signals RX and TX are differential signals and are shown traversing the edge of an integrated circuit die on which the I/O cell may be fabricated. The receiver 86 includes a sampling unit 96 and a termination unit 98. The sampling unit samples the incoming data signal in response to a sampling clock signal SC which is generated by interpolator 90 in response to phase clock signals from a the sampling clock generator. The termination unit provides differential termination and converts the differential data signal into a single-ended signal. A jitter avoidance or drift compensation buffer 94 clocks data in response to either the sampling clock signal SC or a stable transmit clock signal TC. A multiplexer 100 selectively couples data signals from either the buffer 94 or a serializer 102 to a transmit latch 104. Read data signals RDX[0 . . . n] are received at the I/O cell at serializer 102. Another multiplexer may be disposed between buffer 94 and transmit latch 104 with one input connected to the buffer and another input connected to an output of the interpolator.

When the I/O cell needs to merge read data into the data stream, the multiplexer selects its input that is coupled to the serializer so that the transmit latch clocks the read data out of the I/O cell in response to the transmit clock signal TC. Otherwise, the multiplexer selects the data signal from the buffer which is then redriven by the transmit latch. The transmit data signal is converted back to a differential signal by transmitter 106 before being driven onto the next unidirectional link. Write data is taken from the output of the transmit latch, collected in a deserializer 108, and then routed to a deskew circuit, bit lane fail-over mechanism, or other circuitry. The deserializer may also provide a bit line clock signal BLC, which may be derived from the sample clock signal, to indicate when the write data WDX[0 . . . n] is valid.

Some of the inventive principles of this patent relate to deskewing signals separately from redrive paths. A redrive path is defined by one or more components through which a signal propagates as it is received and redriven. For example, in the embodiments of FIGS. 9 and 10, the redrive path includes receiver 86. In the embodiment of FIG. 11, the redrive path includes receiver 86 and buffer 94. In the embodiment of FIG. 12, the redrive path includes sampling unit 96, termination unit 98, buffer 94, multiplexer 100, transmit latch 104, and transmitter 106.

According to some of the inventive principles of this patent, a deskew circuit may be integrated into a redrive circuit such that the individual bit lanes of the deskew circuit are included in the redrive paths. Thus, the signals on the bit lanes may be deskewed in each redrive circuit as it is redriven along a path. Alternatively, however, a deskew circuit according to the inventive principles of this patent may be separate from the redrive paths. For example, in the embodiment of FIG. 7, a deskew circuit is shown separate not only from the redrive paths in redrive circuit 60, but also from the entire redrive circuit. Alternatively, a deskew circuit according to the inventive principles of this patent may be integrated into the redrive circuit, but still be separate from the redrive paths. For example, in the embodiment of FIG. 12, one or more deskew latches may be located at the output of serializer 102 and/or the input of deserializer 108.

The embodiments of methods and apparatus for deskewing signals separately from redrive paths as described above are exemplary only and are not limited to these specific examples. Moreover, the principles relating to deskewing signals separately from redrive paths according to this patent are independent of other inventive principles of this patent. For example, just as the embodiments of redrive circuits illustrated in FIGS. 9-12 are not limited to use in memory systems having separate outbound and inbound paths, so too may the principles relating to deskewing signals separately from redrive paths according to this patent may be used with other types of memory architectures utilizing unidirectional links, e.g., an architecture that utilizes a ring-type arrangement of links such as RamLink.

Some of the inventive principles of this patent relate to coping with failed bit lanes. For example, any of the unidirectional links between any of the agents shown in the embodiments of FIGS. 3, 4, 5, 6 or 7 may have more than one bit lane. According to the inventive principles of this patent, one or more signals may be redirected on the bit lanes to avoid a bad bit lane. Any agent such as a memory controller (host), module, buffer, etc. may be capable of redirecting one or more signals on a number of bit lanes. A signal may be redirected at either or both ends of a link. Any agent may be capable of detecting a failed bit lane either automatically or with assistance from another agent, and any agent may be capable of redirecting signals responsive to a command from another agent.

Figure 13:
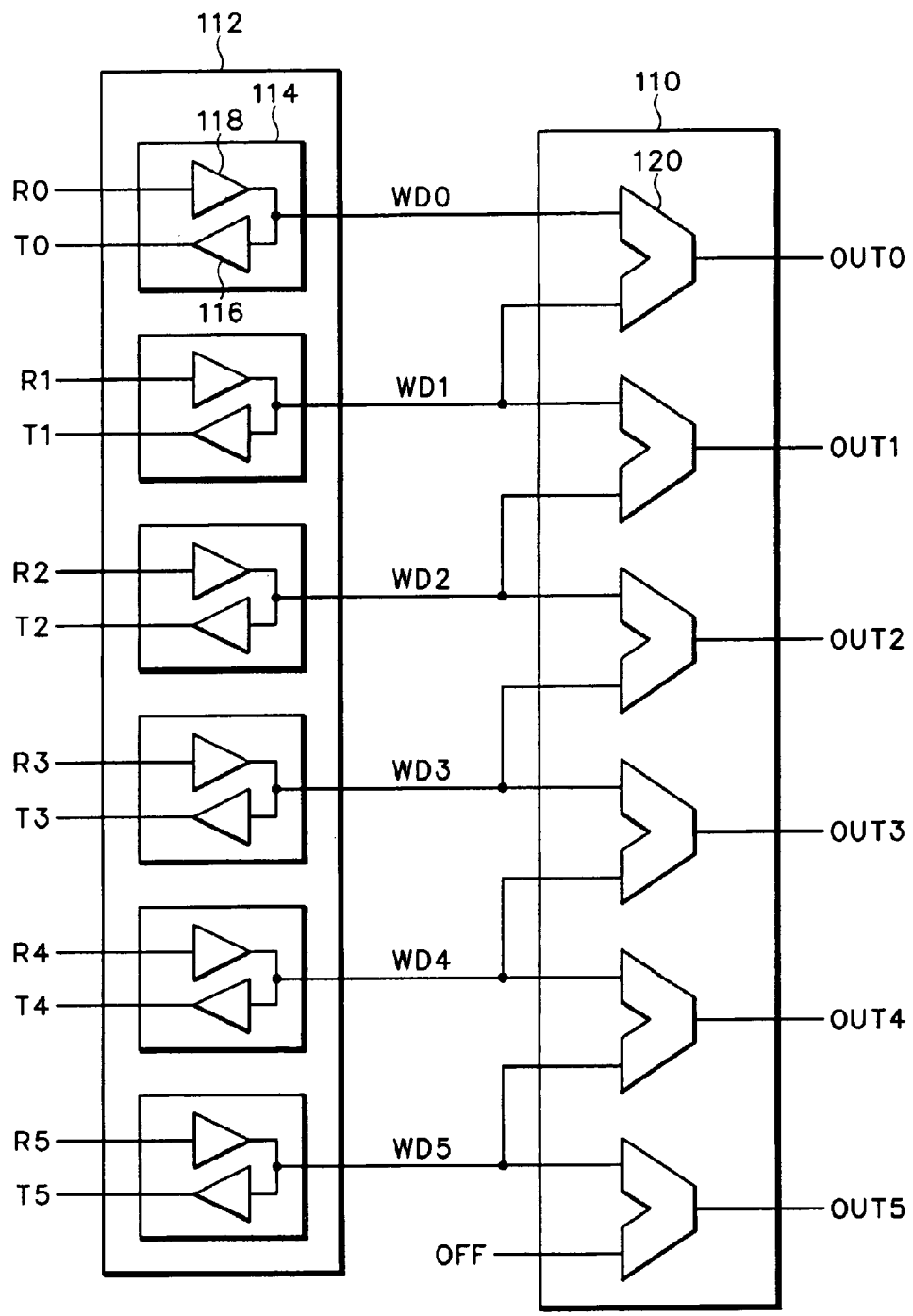
FIG. 13 illustrates an embodiment of a fail-over circuit according to the inventive principles of this patent.

FIG. 13 illustrates an embodiment of a fail-over circuit according to the inventive principles of this patent. The fail-over circuit 110 of FIG. 13 is shown along with an embodiment of a redrive circuit 112 for purposes of illustration only, but the inventive principles are not limited to use with any particular redrive circuit, nor is the fail-over circuit limited to the specific details shown in FIG. 13. Redrive circuit 112 includes a number of bit lanes arranged to receive and redrive signals on unidirectional links. Each bit lane is embodied as an I/O cell 114 having a receiver 116 and a transmitter 118.

A fail-over circuit refers to a circuit that is capable of redirecting one or more signals to or from a plurality of bit lanes. In the embodiment of FIG. 13, the fail-over circuit is implemented as a multiplexer having one or more multiplexer switches 120. Each switch has a first input coupled to one bit lane and a second input coupled to an adjacent bit lane so that it may redirect signals from either bit lane to its output. The embodiment shown in FIG. 13 is shown with six switches to service six bit lanes, but any number switches and bit lanes may be used, and the switches may be arranged in various configurations other than the adjacent bit lane configuration as shown.

Figure 14:
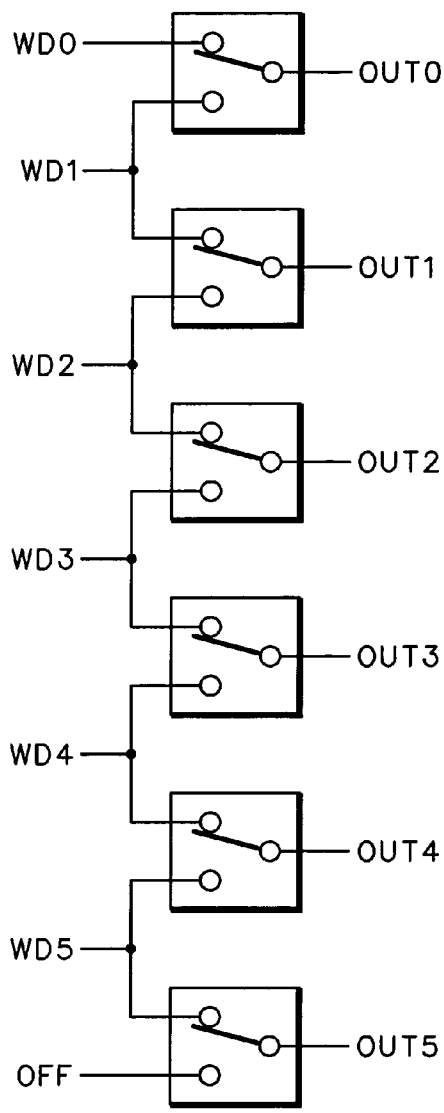
FIG. 14 illustrates another embodiment of a fail-over circuit operating in a normal mode according to the inventive principles of this patent.

During a normal mode of operation, each of the switches directs the signal from its first input to its output as shown in FIG. 14 so that write data signals WD0, WD1, WD2, WD3, WD4, and WD5 are directed to outputs OUT0, OUT1, OUT2, OUT3, OUT4, and OUT5, respectively. In such an embodiment, one of the bit lanes, for example, the bit lane corresponding to WD5, may be used for error checking the data on the other bit lanes.

Figure 15:
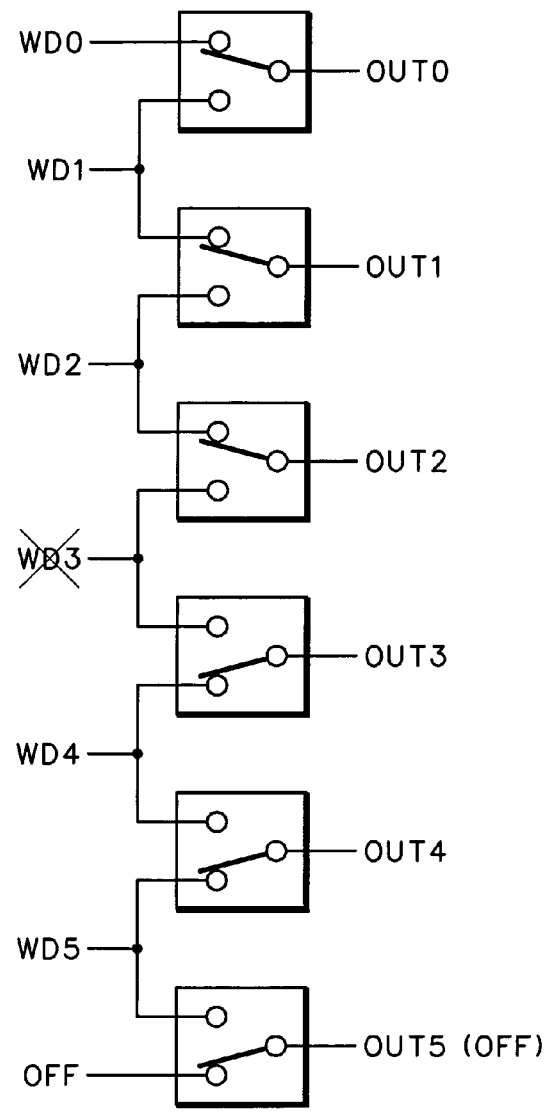
FIG. 15 illustrates another embodiment of a fail-over circuit operating in a fail-over mode according to the inventive principles of this patent.

If a bad bit lane is detected, the multiplexer may operate in a fail-over mode in which one or more of the switches are manipulated to map out the bad bit lane. For example, if the bit lane associated with WD3 does not operate properly, the multiplexer switches may redirect write data signals WD4 and WD5 to outputs OUT3 and OUT4, respectively as shown in FIG. 15. In this mode, one bit lane worth of signal capacity is lost. If one of the bit lanes had been designated for error checking, signals originally intended for the bad bit lane may be rerouted over the error checking lane, and the error checking function may be disabled.

The outputs of the fail-over circuit may be coupled to a memory interface, to a memory device, or to other circuitry. In the embodiment of FIG. 13, the fail-over circuit is shown separate from the redrive circuit, but it may also be integrated into the redrive circuit. A fail-over circuit according to the inventive principles of this patent may be realized with simple multiplexers as shown, but other arrangements such as a full crossbar switch are also possible.

The embodiment of a fail-over circuit shown in FIG. 13 is arranged to couple write data from the bit lanes to its outputs. Alternatively, an embodiment of a fail-over circuit according to the inventive principles of this patent may be arranged to transfer data in the opposite direction, in which case the outputs OUTX would become inputs that receive read data, the multiplexer switches may be referred to as demultiplexer switches, and each of the I/O cells may have a multiplexer between the receiver and transmitter to merge the read data from the fail-over circuit into the bit lane. Thus a multiplexer refers to both a multiplexer and a demultiplexer. As another alternative, an embodiment of a fail-over circuit according to the inventive principles of this patent may be arranged for bi-directional data flow between the bit lanes and memory device, memory interface, or other circuitry.

A memory buffer, memory module, memory controller (host), or other agent having bit lane fail-over capability may also have various capabilities for detecting failed bit lanes, redirecting signals, mapping out bad bit lanes, and the like according to the inventive principles of this patent. For example, an agent having the embodiment of a fail-over circuit shown in FIG. 13 may be designed so that it can detect a failed bit lane, e.g., by observing a test data pattern sent by another agent, and redirecting signals to map-out the failed bit lane. Alternatively, the agent may be designed so that it may map out a failed bit lane in response to a command from another agent, for example, a memory controller that instructs one or more agents on a memory channel. Alternatively, the agent may have both capabilities.

Figure 16:
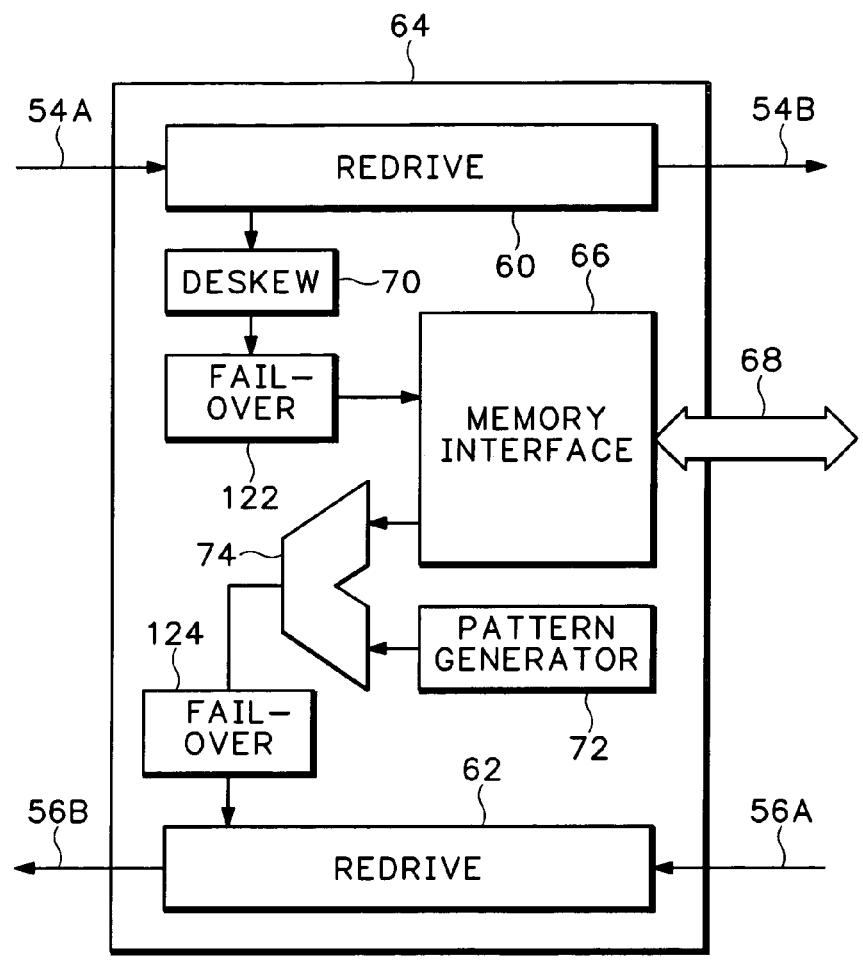
FIG. 16 illustrates an embodiment of a memory buffer with bit lane fail-over capability according to the inventive principles of this patent.

FIG. 16 illustrates an embodiment of a memory buffer with bit lane fail-over capability according to the inventive principles of this patent. The embodiment of FIG. 16 is similar to that of FIG. 7 but also includes a fail-over circuit 122 coupled between the deskew circuit 70 and the memory interface 66. Alternative embodiments are possible. For example, the fail-over circuit may be disposed between the redrive circuit 60 and the deskew circuit, or it may be integrated into the redrive circuit. The embodiment of FIG. 16 also includes another fail-over circuit 124 which is shown coupled between the multiplexer 74 and redrive circuit 62, but which may also be integrated into the redrive circuit or arranged in other ways. The memory buffer of FIG. 16 may alternatively be embodied as a memory module, in which case the memory interface is replaced by a memory device.

Figure 17:
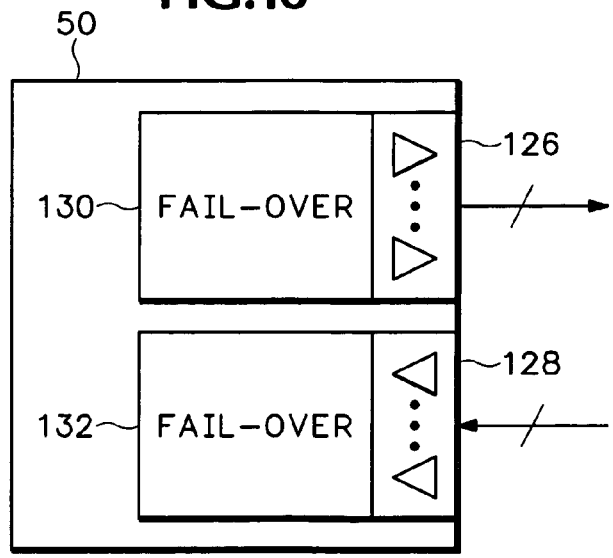
FIG. 17 illustrates an embodiment of a memory controller with bit lane fail-over capability according to the inventive principles of this patent.

FIG. 17 illustrates an embodiment of a memory controller with bit lane fail-over capability according to the inventive principles of this patent. The controller of FIG. 17 includes outbound and inbound unidirectional link interfaces 126 and 128 having a plurality of bits lanes which, in this embodiment, include a number of transmitters and a number of receivers, respectively. Fail-over circuits 130 and 132 are coupled to the bit lanes in the interfaces 126 and 128, respectively. In the embodiment of FIG. 17, the fail-over circuits are shown separate from the link interfaces, but they may alternatively be integral with the interfaces. The controller may be capable of detecting a failed bit lane, in which case the fail-over circuits may map out the failed bit lane. Additionally or alternatively, the controller may be capable of issuing a command that directs an agent to map out a failed bit lane.

Additional fail-over methods and apparatus according to the inventive principles of this patent will now be described in the context of an exemplary embodiment of a complete memory channel system including additional embodiments of a memory controller (host), memory modules, and memory buffers according to the inventive principles of this patent. None of the components, however, are limited to this exemplary system or any of the details described therein.

The exemplary system includes an embodiment of a host having fail-over capabilities such as those described with reference to FIG. 17 and embodiments of one or more memory modules having buffers with fail-over capabilities such as those described with reference to FIG. 16. In this example, the host and modules are arranged in a channel configuration having outbound and inbound paths such as that shown in FIG. 7, although the system may only include one module.

In this example, the host and modules are interconnected with a system management bus known as "SMBus", which is a serial bus system used to manage components in a system. However, the use of SMBus is not necessary to the inventive principles of this patent, and other forms of communication between components may be used, including the memory channel paths themselves.

An embodiment of a method according to the inventive principles of this patent for detecting and mapping out a failed bit lane in the exemplary system proceeds as follows. The host transmits a test pattern on each bit lane of the outbound path. The test pattern is received and redriven along the outbound path by the buffer on each module until it reaches the outermost module. The outermost module then transmits a test pattern on each bit lane of the inbound path. The test pattern is received and redriven along the inbound path by the buffer on each module until it reaches the host. The host and the buffers on the modules observe the test pattern on each bit lane of the inbound and/or outbound paths to check for proper bit lane operation. The bit lanes in the inbound and outbound paths may be tested concurrently.

Failed bit lanes are reported by sending results to the host through the SMBus and/or by transmitting a results frame over the channel to the host. Such a results frame may be initiated on the inbound path by the outermost module, and the other modules, if any, may merge their results information into the data in the inbound path. If the results from each module are transmitted redundantly on more than one bit lane, a failed bit lane is unlikely to interfere with reporting the results.

Once the host receives the results, it may issue a configuration command to the modules, through the SMBus, over the channel, or through any other form of communication. The configuration command instructs the modules which, if any, bit lanes are bad and should be mapped out. The modules respond to the configuration command by manipulating one or more fail-over circuits to redirect signals around bad bit lanes, if any, and reconfiguring any internal functionality to accommodate the loss of a bit lane. For example, if one bit lane was designated for error checking data, the buffer or module may disable error checking functions.

The embodiments of fail-over methods and apparatus described above are exemplary only, and the inventive principles of this patent are not limited to these specific examples. The principles of fail-over methods and apparatus according to this patent have been described with reference to a memory system having separate inbound and outbound paths such as the embodiment of FIG. 3, but the principles may also be applied to any memory architecture utilizing unidirectional links, for example an architecture that utilizes a ring-type arrangement of links such as RamLink.

Some of the inventive principles of this patent relate to permuting status patterns. In memory systems such as those described above with reference to FIGS. 1 and 3 where memory read and write data is transferred between memory agents, it may also be useful to send status information such as idle patterns, alert patterns, and other status information between memory agents. This may be accomplished by sending data patterns and status patterns on the same link or links that connect the memory agents. According to the inventive principles of this patent, the status patterns may be permuted over time.

For example, referring to FIG. 3, the memory controller 50 may send frames having data patterns such a read commands to one or more of the modules 52 which respond by sending frames having data patterns such as read data back to the controller. It may be useful for the one or more of the modules to send a frame having an idle pattern back to the memory controller, for example, if the module was not able to retrieve read data from a memory device 58 fast enough. A predetermined data pattern may be designated as an idle pattern so that, if the memory controller receives the idle pattern, it knows it is not receiving read data. This may cause problems, however, if the actual read data pattern happens to match the designated idle pattern.

Figure 18:
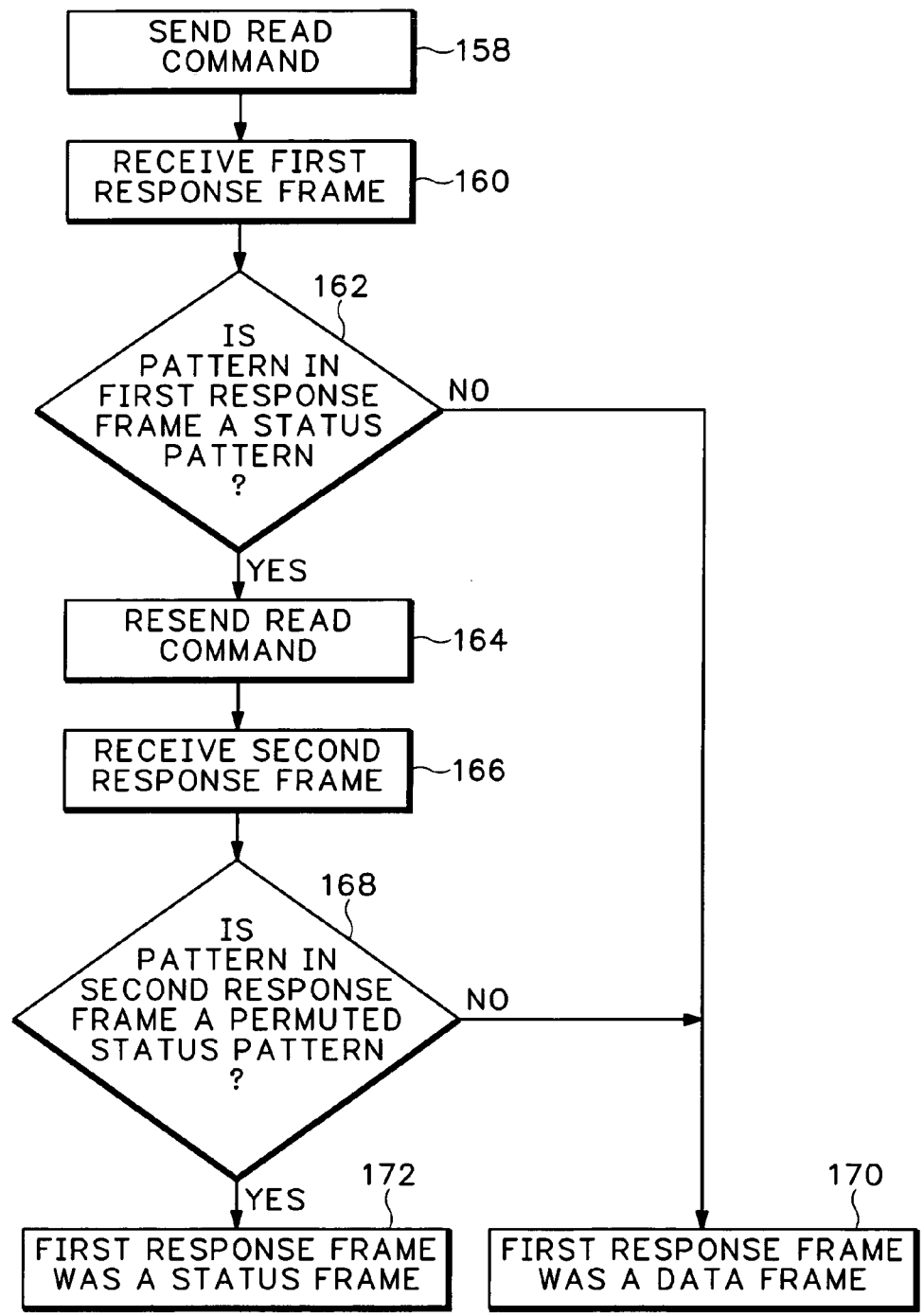
FIG. 18 illustrates an embodiment of a method for implementing permuting status patterns according to the inventive principles of this patent.

According to the inventive principles of this patent, the memory controller and one or more modules may both be capable of permuting the idle pattern in a predictable manner so that the idle pattern changes over time. For example, the memory controller and modules may change the idle pattern according to a predetermined sequence each time an idle frame is sent and/or received. An embodiment of such a method according to the inventive principles of this patent is illustrated in FIG. 18. Thus, if the memory controller sends a read command frame (158) and receives a response frame (160) having the current idle pattern (162), it may resend the same read command (164). If the second response frame (166) contains the same pattern as the first (168), it interprets the pattern as actual read data (170). If, however, the pattern in the second response frame matches the permuted idle pattern (168), the memory controller knows that the first response frame was an idle frame (172).

According to the inventive principles of this patent, the status information sent in status patterns may be idle patterns, alert patterns, and other status information such as command error information from a module, thermal overload information from a module, and information that indicates that a module has detected the presence of another module on the outbound path of memory channel. Some types of status patterns may be implemented as complementary patterns. For example, an alert pattern (which may be used to notify an agent of an error condition) may be implemented as the logical complement of an idle pattern. This may simplify the implementation by, for example, allowing a memory agent to use the same pattern generator for idle and alert patters. The use of complementary status patterns may be beneficial even if permuting patterns are not used.

A memory agent according to the inventive principles of this patent may also be capable of intentionally generating an error such as a cyclical redundancy check (CRC) error in a status pattern. Such a technique may be useful as an alternative or supplemental way to distinguish a data pattern from a status pattern. For example, in some memory systems, each frame is sent along with a CRC code that is used to check the integrity of the data in the frame. According to the inventive principles of this patent, a memory agent may intentionally send the wrong CRC code with frame that contains a status pattern. The receiving agent may then interpret the frame as a status frame rather than a data frame. Some memory systems may utilize a path or paths having an extra bit lane to carry CRC data. If such a system is capable of operating in a fail-over mode, the agent or agents may only utilize an intentional CRC error if not operating in fail-over mode. As used herein, the term CRC refers not only to a cyclical redundancy check, but also to any other type of error checking scheme used to verify the integrity of a frame or pattern.

Although the principles of status pattern permuting and handling according to the inventive principles of this patent are applicable to any type of memory agent, and are independent of other inventive principles of this patent, some additional aspects will be described with respect to a memory buffer such as the embodiment shown in FIG. 7 and in the context of a system such as the embodiment shown in FIG. 6. Referring to FIG. 6, if the memory buffer 64 is the outermost agent on a memory channel, it may be capable of constantly transmitting permuting idle status frames on the inbound link 56B whenever it is not sending data that the host has requested from any memory devices attached to the memory interface 68.

Figures 19, 20:
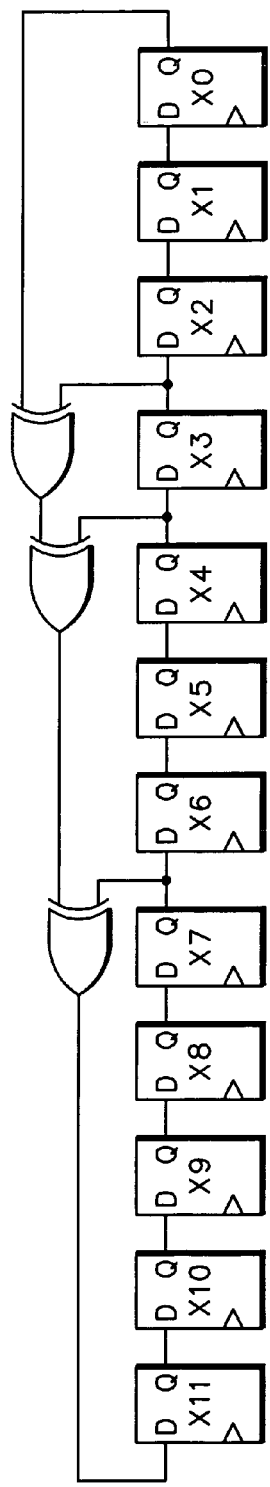

FIG. 19 illustrates an embodiment of a permuting pattern generator in accordance with the inventive principles of this patent. The embodiment of FIG. 19 is a 12-bit linear-feedback shift register (LFSR) with a polynomial of $x^{12}+x^7+x^4+x^3+1$. The initial state may be set to 000000000001, and the LFSR cycles through $2^{12}-1$ states (4095 frames) before the pattern is repeated. Each bit of the LFSR may be mapped to a bit lane in a link on a data path, and each bit may be used for all of the transfers that occur on the corresponding bit lane during an entire frame. For example, in a system having a data path with 12 bit lanes in each link, the output from each stage of the LFSR may be mapped to one of the bit lanes. Additional lanes, for example, a 13th bit lane, may be accommodated by utilizing the value from the least significant bit of the LFSR delayed by one frame.

Figures 23, 24:
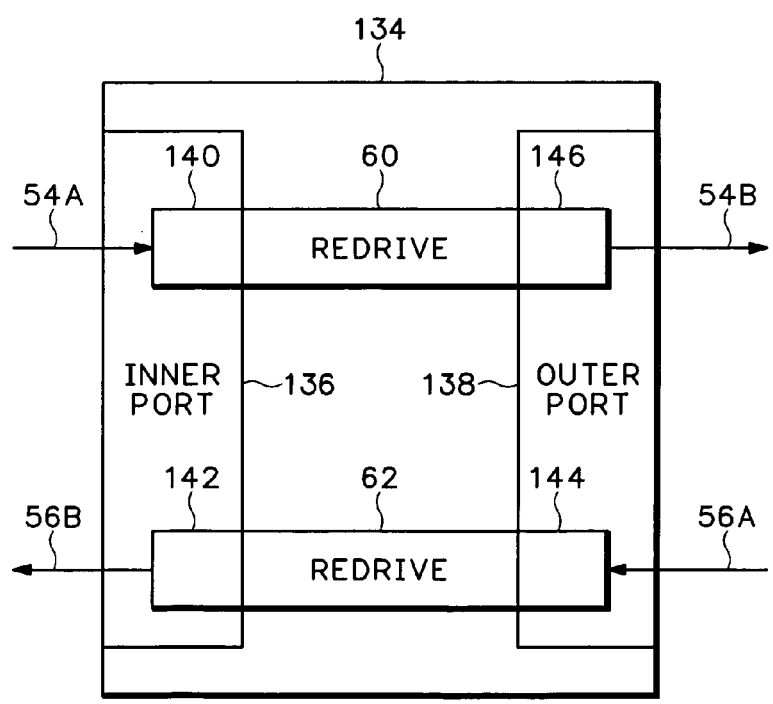

FIG. 20 illustrates an example of the first status pattern generated by the permuting pattern generator of FIG. 19. In this example, a frame is 12 transfers long. FIGS. 21-23 illustrate the second, third and forth status patterns, respectively. By using the same value on each bit lane during an entire frame, electromagnetic interference (EMI or noise) may be reduced.

The 13 bit lane by 12 bit transfer frame illustrated here is by way of example, and the inventive principles of this patent are not limited to these details, nor to the specific embodiment of a permuting pattern generator described above. For example, a permuting pattern generator according to the inventive principles of this patent need not be implemented with dedicated logic circuitry such as the LFSR described above. Alternatively it may be implemented with programmable logic, or as an algorithm in a processor or other programmable state machine that may be used to oversee and/or implement the logic in the memory interface or other functionality of a buffer or other memory agent that utilizes permuting status patterns.

Some additional inventive principles of this patent relate to utilizing more than one bit lane to detect the presence of a memory agent on a memory link. For example, in the embodiment of a memory buffer shown in FIG. 7, the buffer may be capable of detecting whether there is another memory agent coupled to the outbound link 54B. This may be accomplished by utilizing a single bit lane in the link to test for the presence of another memory agent. If there is more than one bit lane in the link, however, more than one of the bit lanes may be used to detect the presence of another memory agent according to the inventive principles of this patent. This may prevent the existence of a bad bit lane from interfering with the presence detect operation.

For convenience, the inventive principles of this patent relating to utilizing more than one bit lane to detect the presence of a memory agent will be referred to individually and collectively as redundant presence detect. Redundant presence detect may be applied to any type of memory agent having a link interface with a plurality of bit lanes. For example, any two or more of the transmitters 118 shown in the embodiment of FIG. 13 may be considered a link interface, in this case a transmit link interface. Likewise, any two or more of the receivers 116 shown in FIG. 13 may be considered a link interface, in this case a receive link interface. Redundant presence detect may be applied to either of these link interfaces, as well as either of the link interfaces 126 and 128 shown in the embodiment of FIG. 17.

Returning to the embodiment of FIG. 7 as an example again, the memory buffer may drive three bit lanes on its inbound transmit link 56B to a predetermined presence detect logic level, e.g., one, to signal its presence to another buffer when a presence detect event such as a reset occurs. Also during a presence detect event, a second such memory buffer located inbound from the first buffer on a channel may configure the corresponding three bit lanes on its inbound receive link 56A to detect the presence of the first buffer. In this example, the first memory buffer will be referred to as an outer agent, and the second buffer will be referred to as an inner agent.

An example of a technique for configuring a bit lane to detect the presence of another agent is to have the receiver for that bit lane try to place a bias current on the bit lane so as to force the bit lane to the opposite of the presence detect logic level. If another memory agent is coupled to the bit lane during a presence detect event, its transmitter on that bit lane will force the bit lane to the presence detect logic level.

If the inner agent detects the presence detect logic level on two of the three bit lanes, it knows that the outer agent is present and it may leave all or a portion of its outer port enabled. (In this example, the outer port includes the link interface for the outbound link 54B and the link interface for the inbound link 56A.) If the inner agent fails to detect the presence detect logic level on at least two of the three bit lanes, it may decide that an outer agent is not present and it may disable all or a portion of its outer port. The inner agent may be capable of reporting the presence or absence of an outer agent to another agent, for example to a memory controller in response to a status check command.

An agent utilizing redundant presence detect may also be capable of signaling a presence detect event to another agent. For example, if a reset event is communicated to the buffer of FIG. 7 through a reset command on the outbound path, this command may be relayed to an outer agent, if any, by redrive circuit 60. This may place both agents in a presence detect mode.

Redundant presence detect according to the inventive principles of this patent is not limited to the specific embodiments discussed above. For example, only two bit lanes may be used for presence detect instead of three as in the example above, in which case the inner agent would only need to detect the presence detect logic level on a single bit lane to conclude that an outer agent was present. Likewise, redundant presence detect may be applied to systems and components utilizing various other types of memory architectures, e.g., an architecture that utilizes a ring-type arrangement of links such as RamLink.

Some additional inventive principles according to this patent relate to hot insertion and/or removal of components from a memory channel—that is, adding and/or removing components while the memory channel is operating. FIG. 24 illustrates an embodiment of a memory agent 134 according to the inventive principles of this patent. The embodiment of FIG. 24 may be a memory module, memory buffer, memory controller, etc. The agent includes a first port 136 and a second port 138. If the agent is assumed, for purposes of illustration only, to be a memory module such as one of modules 52 in the embodiment of FIG. 6, the first port may be designated as an inner port since it may be arranged to communicate with other agents on the memory channel that are located closer to the memory controller. Likewise, the second port may be designated as an outer port since it may be arranged to communicated with agents on the memory channel that are located further away from the memory controller. These designations are for purposes of illustration only, and the inventive principles are not limited to these details of the memory agent nor to the particulars of the memory channel shown in FIG. 6. These principles may also be applicable to other memory channel architectures such as the RamLink architecture shown in FIG. 1.

Each port of a memory agent according to the inventive principles of this patent has one or more link interfaces. In the embodiment of FIG. 24, each port has both a receive link interface and a transmit link interface. The inner port 136 has a receive link interface 140 which may be one or more receivers that are part of a redrive circuit 60, and a transmit link interface 142 which may be one or more transmitters that are part of another redrive circuit 62. The outer port has receive and transmit link interfaces 144 and 146, respectively, which are also part of redrive circuits 62 and 60, respectively. Link interfaces 140 and 146 may be coupled to outbound links 54A and 54B, respectively, and link interfaces 142 and 144 may be coupled to inbound links 56B and 56A, respectively. Each of the link interfaces may have one or more bit lanes, and the bit lanes and interfaces may be referred to using any combination of this terminology. For example, the bit lanes in interface 142 may be referred to as the inbound transmit or inbound Tx bit lanes. The bit lanes in interface 144 may be referred to as the inbound receive or inbound Rx bit lanes.

The embodiment of FIG. 24 is exemplary only, and memory agents and ports may be embodied in different ways. For example, link interfaces are not necessarily part of a redrive circuit. This is illustrated in the embodiment of a memory controller shown in FIG. 17 wherein a port may include the link interfaces 126 and 128 which are not part of redrive circuits. The link interfaces may include only one or any number of bit lanes, and a port may only have a receive link interface or a transmit interface.

A memory agent according to the inventive principles of this patent may be capable of detecting the presence of another memory agent on one of its ports, and it may be capable of taking various actions depending on the presence or absence of another memory agent. For example, the memory agent of FIG. 24 may be capable of disabling all or a portion of its outer port if another memory agent is not present at the port. It may be capable of reporting the presence or absence of an outer agent to another agent, for example to a memory controller through its inner port. The memory agent of FIG. 24 may be capable of performing a presence detect operation which may include signaling a presence detect event to a potential outer agent on the outer port. It may also be capable of performing a fast reset operation.

Some additional inventive principles which may facilitate hot add/removal in accordance with this patent application will be described in the context of an example embodiment of a memory system. The example embodiment will be described with reference to the memory agent of FIG. 24 in the context of a memory system such as the embodiment of FIG. 6. In this example embodiment, it will be assumed that the memory agent of FIG. 24 is used to embody one or more of the buffers in FIG. 6, which in turn are part of modules having memory devices. All of these details, however, are for purposes of explanation only, and the inventive principles are not limited to these details.

In the example system, the memory agents may be capable of executing fast reset operations, full reset operations, and/or various polling or presence detect operations. In the example system, a minimum number of clock transitions may be necessary to keep the derived clocks on each bit lane locked to the data stream. Thus, the memory controller (or host) may initiate a reset operation by sending a continuous stream of ones or zeros on one or more of the bit lanes in the outbound path for a predetermined period of time. Since the data is redriven by each buffer on the path, all of the buffers receive the reset command, or event. In the example system, the three least significant bit (LSB) lanes may be used to signal a reset operation. The receiving agent may detect the reset event by sensing the stream of zeros or ones on any two of the three LSBs. This may assure that the presence of one failed bit lane does not interfere with a reset operation, but the inventive principles, which do not even require more than one bit lane, are not limited to such an implementation.

In the example system, the host may send a continuous stream of zeros to hold all of the agents on the channel (in this example modules having buffers) in a first reset state indefinitely, for example while the host is held in reset by external conditions. The host may then send a stream of ones for a first amount of time, e.g., two frame periods, and then back to zeros to signal the other agents to execute a fast reset operation. Alternatively, the host may send a stream of ones for a second amount of time, e.g., more than two frame periods, to signal the other buffers to execute a full reset operation. A full reset may include various internal calibration operations such as impedance matching on the links, current source calibration in any receiver or drive circuitry, receiver offset cancellation, and the like. After the calibration operations are performed, the host may then signal the buffers to transition to the fast reset operation.

A fast reset operation may bypass certain operations performed during a full reset such as calibration operations. A fast reset operation may begin with a presence detect operation. During a presence detect operation, each buffer on the channel may place a current on the three LSB inbound Rx bit lanes to force the bits to zero if they are not connected to an outer agent. Also during a presence detect operation, each buffer may drive the three LSB inbound Tx bit lanes to one. Each buffer may then check its three LSB inbound Rx bit lanes, and if it detects ones on two of the three lanes, it may leave its outer port enabled and update a status register accordingly. If the buffer does not detect two ones, it may assume that there is no outer agent, disable all or a portion of its outer port, configure itself to perform the functions of the outermost agent on the channel, and/or update a status register accordingly. A host may follow a similar presence detect operation to determine if any agents are on the channel. The buffers may relay the status information to the host in status frames in response to status requests from the host.

After a presence detect operation, the buffers in the example system may transition through various other operations during a fast reset such as a clock training state to train the local clocks on the buffers to lock onto the data stream, a frame training state to align frames that are sent over the channel, bit lane tests to check the operation of all bit lanes and place the buffers in fail-over mode if they have such a capability, etc. Also, once the host knows how may other agents are connected to the channel, it may adjust the frame size, timing, etc. to accommodate all of the agents.

Figure 25:
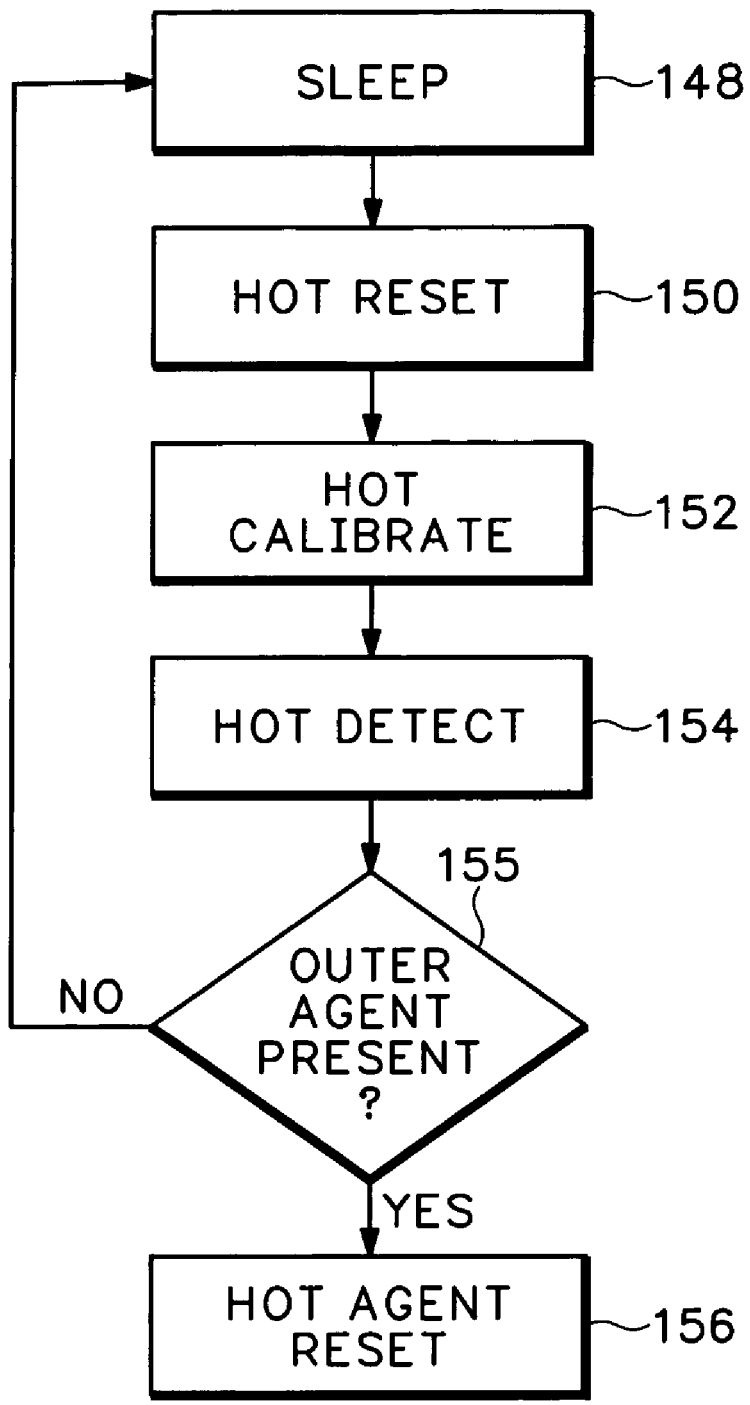
FIG. 25 illustrates an embodiment of a polling operation according to the inventive principles of this patent.

In the example system, the memory agents may also or alternatively be capable of performing various polling operations to detect the presence of newly added agents on the channel. For example, each buffer may be capable of performing a polling operation on its outer port if it is the outermost buffer to determine if a new agent has been added to the channel. FIG. 25 illustrates an embodiment of such a polling operation according to the inventive principles of the patent.

At 148, the agent may disable all or a portion of its outer port. If the agent is a buffer or module, it may wait for a poll command from the host to transition to a hot reset operation at 150. If the agent is a host, it may disable all or a portion of its outer port and wait for a wake up command from a system environment. Upon receiving the wake up command, it may in turn enable all or a portion of its outer port and transition to a reset state.

At 150, the agent may enable its outer port and drive zeros onto the three LSB outbound Tx bit lanes to send a reset to a potential new agent on its outer port. The agent may then transition to a hot calibration operation at 152.

At 152, the agent may drive ones onto the three LSB outbound Tx bit lanes to force a potential new agent through a full reset including calibration operations, since a newly detected agent would presumably need to be calibrated. The agent may then transition to a hot detect operation at 154.

At 154, the agent may drive zeros onto the three LSB outbound Tx bit lanes and place a bias current on the three LSB inbound Rx bit lanes to force the bits to zero if they are not connected to an outer agent. The agent may then check the three LSB inbound Rx bit lanes, and if it detects at least two ones, it may decide at 155 that an outer agent is present and transition to a hot agent present operation at 156. Otherwise, the agent may decide at 155 that an outer agent is not present and transition back to the sleep operation at 148.

At 156, the agent may update a status register to indicate that it has detected an outer agent and then relay this information to the host, for example, in response to a status request, or take some other action to relay the information to the host or other agent. The agent may also wait to receive a channel reset.

The host may become aware of the newly detected agent, either through periodic status requests, or other techniques and initiate a fast reset to re-initialize the entire channel with the new agent on the channel and accommodated in the channel timing.

The following are some additional embodiments of hot add/removal sequences according to the inventive principles of this patent. These additional embodiments are also described with reference to the embodiment of the memory system shown in FIG. 6 in the context of a larger system, such as a server having a user interface and system firmware, that employs the memory system of FIG. 6. The inventive principles illustrated by these additional embodiments, however, are not limited to the specific details described herein.

A hot add sequence according to the inventive principles of this patent may begin when a user appends a new agent onto the memory channel, for example on the outer port of the outermost agent. The user may inform the system firmware that an agent has been appended. The firmware may then cause power to be applied to the appended agent and inform the host through a wake up command that an agent has been appended. The host may then send a poll command to the previous outermost agent, which then may cycle through a polling operation such as the one described above with reference to FIG. 25. After the polling operation, the previous outermost agent may report the presence of a new outer agent. The host may then detect the presence of the new agent and issue a fast reset command to bring the new agent into operation and retime the entire channel. After the new agent is operational, the host may interrupt the system firmware to report that the new agent is operational. Alternatively, the host may wait for the system firmware to query the host to determine if the new agent is operational. The system firmware may then configure the host to accommodate any new hardware presented by the new agents such as new memory devices that may be present if the agent was a memory module or buffer.

A hot removal sequence according to the inventive principles of this patent may begin when a user informs the system that a specific agent on a memory channel is to be removed. The system may remove a corresponding host address range from a system map. If the system uses mirroring, the system may remap the host address ranges to agent mirrors. The system may then copy or move data from the host address range to other locations if not already mirrored. The system may then poll until all outstanding transactions are completed. The system may then cause the host to send a command to the agent just inside of the agent to be removed that causes this agent to assume it is the outermost agent on the channel, thereby causing it to disable its outer port and assume the functions of the outermost agent during subsequent fast resets. (A full reset would override this command.) The system may then initiate a fast reset to shut down the selected agent and any channel interfaces for components attached to the selected agent. The system may then disconnect power to the selected agent and notify the user that the agent may be removed.

A hot replace sequence according to the inventive principles of this patent may begin when the hot remove sequence described above is completed. The user may add a new agent in place of the one removed and then inform the system firmware that the new agent has been added. The running system may then prepare the host for the newly replaced component and supply power to the new component. System firmware may then cause the host to send a command to the previous outermost agent to let is know that it should no longer assume that it is the outermost agent. This may cause the previous outermost agent to enable its outer port in response to the next reset, and wait for a poll command. Firmware may then instruct the host to send a poll command to the previous outermost agent which may then perform a polling operation such as the one described above with reference to FIG. 25, thereby initializing the new agent. The previous outermost agent may then report the presence of a new outer agent. The host may then detect the presence of the new agent and issue a fast reset command to bring the new agent into operation and retime the entire channel. After the new agent is operational, the host may interrupt the system firmware to report that the new agent is operational. Alternatively, the host may wait for the system firmware to query the host to determine if the new agent is operational.

The embodiments described herein may be modified in arrangement and detail without departing from the inventive principles. Accordingly, such changes and modifications are considered to fall within the scope of the following claims.

The invention claimed is:

1. A memory agent comprising:
a link interface having a plurality of bit lanes to transfer memory read or write data;
wherein the memory agent is capable of utilizing more than one of the plurality of bit lanes to detect the presence of another memory agent coupled to the link interface; and
wherein the link interface is a first link interface, and the memory agent comprises a memory buffer further including:
second, third and fourth link interfaces having second, third and fourth pluralities of bit lanes, respectively, to transfer memory read or write data;
a first redrive circuit to redrive memory read or write data from the first link interface to the second link interface;
a second redrive circuit to redrive memory read or write data from the third link interface to the fourth link interface; and
a memory interface coupled to the first and second redrive circuits;
wherein the memory buffer may utilize more than one of the second plurality of bit lanes to signal its presence to another memory agent coupled to the second link interface.

2. A memory agent according to claim 1 wherein the memory agent is capable of utilizing at least three of the plurality of bit lanes to detect the presence of another memory agent coupled to the link interface.

3. A memory agent according to claim 2 wherein the memory agent is capable of determining that another memory agent is coupled to the link interface if the memory agent detects another memory agent on two of the at least three of the plurality of bit lanes.

4. A memory agent according to claim 1 wherein the memory agent is capable of disabling all or a portion of the link interface if it does not detect the presence of another memory agent coupled to the link interface.

5. A memory agent according to claim 1 wherein the memory agent is capable of performing functions of an outermost agent if it does not detect the presence of another memory agent coupled to the link interface.

6. A memory agent according to claim 1 wherein the memory agent is capable or reporting whether another memory agent is coupled to the link interface.

7. A memory agent according to claim 1 wherein the memory agent further comprises a second link interface to signal a presence detect event to another memory agent.

8. A memory agent according to claim 1 wherein the memory agent comprises a memory module.

9. A memory agent according to claim 1 wherein the memory agent comprises a memory controller.

10. A memory agent according to claim 1 wherein the memory agent further comprises a second link interface having a second plurality of bit lanes to transfer memory read or write data, wherein the memory agent is capable of utilizing more than one of the second plurality of bit lanes to signal its presence to another memory agent coupled to the second link interface.

11. A method comprising:
utilizing more than one of a plurality of bit lanes to detect the presence of a second memory agent coupled to a first memory agent by the plurality of bit lanes, wherein the bit lanes are also used to transfer memory read or write data;
wherein the bit lanes are coupled to a first link interface included in the first memory agent;
wherein the first memory agent comprises a memory buffer including:
second, third and fourth link interfaces having second, third and fourth pluralities of bit lanes, respectively, to transfer memory read or write data;
a first redrive circuit to redrive memory read or write data from the first link interface to the second link interface;
a second redrive circuit to redrive memory read or write data from the third link interface to the fourth link interface; and
a memory interface coupled to the first and second redrive circuits; and
wherein the memory buffer may utilize more than one of the second plurality of bit lanes to signal its presence to another memory agent coupled to the second link interface.

12. A method according to claim 11 further comprising signaling a presence detect event from the first memory agent to the second memory agent.

13. A method according to claim 11 further comprising reporting from the first memory agent to a third memory agent the presence of the second memory agent.

14. A system comprising:
a memory agent comprising a link interface having a plurality of bit lanes to transfer memory read or write data, wherein the memory agent is capable of utilizing more than one of the plurality of bit lanes to detect the presence of another memory agent coupled to the link interface; and
a memory controller coupled to the memory agent;
wherein the link interface is a first link interface, and the memory agent comprises a memory buffer further including:
second, third and fourth link interfaces having second, third and fourth pluralities of bit lanes, respectively, to transfer memory read or write data;
a first redrive circuit to redrive memory read or write data from the first link interface to the second link interface;
a second redrive circuit to redrive memory read or write data from the third link interface to the fourth link interface; and
a memory interface coupled to the first and second redrive circuits; and
wherein the memory buffer may utilize more than one of the second plurality of bit lanes to signal its presence to another memory agent coupled to the second link interface.

15. A system according to claim 14 wherein the memory agent is a memory buffer.

16. A system according to claim 14 wherein the memory agent is a memory module.

17. A system according to claim 14 wherein the memory controller is capable of signaling a presence detect event to the memory agent.

18. A system according to claim 17 wherein the memory agent is capable of relaying the presence detect event to another memory agent.

19. A system according to claim 18 wherein the presence detect event is a reset event.

* * * * *